US012575363B2

(12) United States Patent
Yamamoto

(10) Patent No.: US 12,575,363 B2
(45) Date of Patent: Mar. 10, 2026

(54) SUBSTRATE PROCESSING APPARATUS, ANALYSIS METHOD, DISPLAY DEVICE, AND PROGRAM

(71) Applicant: SCREEN Holdings Co., Ltd., Kyoto (JP)

(72) Inventor: Shinji Yamamoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 996 days.

(21) Appl. No.: 17/699,685

(22) Filed: Mar. 21, 2022

(65) Prior Publication Data

US 2022/0310427 A1 Sep. 29, 2022

(30) Foreign Application Priority Data

Mar. 24, 2021 (JP) ................................. 2021-049992
Sep. 16, 2021 (JP) ................................. 2021-151490

(51) Int. Cl.
*H01L 21/67* (2006.01)
*G05B 19/418* (2006.01)
(Continued)

(52) U.S. Cl.
CPC .... *H01L 21/67253* (2013.01); *G05B 19/4189* (2013.01); *G06T 11/206* (2013.01);
(Continued)

(58) Field of Classification Search
CPC ......... H01L 21/67253; H01L 21/68707; H01L 21/67178; H01L 21/67742;
(Continued)

(56) References Cited

U.S. PATENT DOCUMENTS 6,556,949 B1 * 4/2003 Lyon ................ G05B 19/41875
702/182
6,671,570 B2 * 12/2003 Schulze .................. H01L 22/20
700/121
(Continued)

FOREIGN PATENT DOCUMENTS

CN 104067189 A 9/2014
CN 109863457 A 6/2019
(Continued)

OTHER PUBLICATIONS

Prakash Poobalan, "Equipment and Process Performance Improvement Using Automated Monitoring System", 2009, 95 pages, downloaded from chrome-extension://efaidnbmnnnibpcajpcglclefindmkaj/http://eprints.utm.my/9865/1/PrakashPoobalanMFKM2009.pdf (Year: 2009).*

(Continued)

*Primary Examiner* — Robert E Fennema
*Assistant Examiner* — Olvin Lopez Alvarez
(74) *Attorney, Agent, or Firm* — OSTROLENK FABER LLP

(57) ABSTRACT

An information storage stores operation information regarding operations of an operating part group including a load port group, a processing unit group, and a transport mechanism. The operation information includes processing result information indicating a result of substrate processing performed by a substrate processing apparatus, and operational status information indicating temporal breakdowns of operational statuses of the substrate processing apparatus and operating parts included in the operating part group. The display controller displays the processing result information while arranging it according to an arrangement item selected from a predetermined arrangement item including an arbitrary operating period of the substrate processing apparatus. The display controller classifies the operational status infor- (Continued)

mation into broadly classified operational statuses and into specifically classified operational statuses and displays the classified operational status information. This enables an operator to easily recognize detailed operational statuses of the operating parts in association with the result of substrate processing.

14 Claims, 27 Drawing Sheets

(51) Int. Cl.
    *G06T 11/20*         (2006.01)
    *H01L 21/687*      (2006.01)

(52) U.S. Cl.
    CPC ................. *H01L 21/68707* (2013.01); *G05B 2219/45031* (2013.01); *G05B 2219/50387* (2013.01)

(58) Field of Classification Search
    CPC ......... H01L 21/67276; H01L 21/67259; H01L 21/67155; G05B 19/4189; G05B 2219/45031; G05B 2219/50387; G05B 23/0272; G05B 23/02; G06T 11/206
    See application file for complete search history.

(56) References Cited

U.S. PATENT DOCUMENTS

| | | | | |
|---|---|---|---|---|
| 7,012,684 | B1 | 3/2006 | Hunter ....................... | 356/237.5 |
| 10,691,089 | B2 | 6/2020 | Ando et al. | |
| 2001/0039503 | A1* | 11/2001 | Chan ..................... | G16H 40/67 |
| | | | | 705/2 |
| 2004/0073327 | A1 | 4/2004 | Shimada et al. ............. | 700/108 |
| 2007/0219664 | A1 | 9/2007 | Yasukawa et al. .......... | 700/223 |
| 2008/0091382 | A1* | 4/2008 | Ang ................... | G05B 23/0294 |
| | | | | 702/182 |
| 2009/0006300 | A1* | 1/2009 | Battenberg ....... | G05B 19/41875 |
| | | | | 706/47 |
| 2009/0009741 | A1 | 1/2009 | Okita et al. ..................... | 355/53 |
| 2009/0125276 | A1* | 5/2009 | Koizumi .......... | H01L 21/67276 |
| | | | | 702/182 |
| 2015/0220869 | A1* | 8/2015 | Spencer ............. | G06Q 10/0639 |
| | | | | 705/7.41 |

| | | | | |
|---|---|---|---|---|
| 2019/0257647 | A1 | 8/2019 | Ichinose et al. | |
| 2020/0097382 | A1 | 3/2020 | Naohara et al. | |
| 2020/0194296 | A1* | 6/2020 | Numakura .......... | H01L 21/6831 |

FOREIGN PATENT DOCUMENTS

| | | | | |
|---|---|---|---|---|
| JP | H07-251356 | A | 10/1995 | |
| JP | 2004-133620 | A | 4/2004 | |
| JP | 2010-040917 | A | 2/2010 | |
| JP | 5950947 | B2 * | 7/2016 | .......... G05B 19/409 |
| JP | 2018-165763 | A | 10/2018 | |
| JP | 2020-047077 | A | 3/2020 | |
| JP | 2020077216 | A * | 5/2020 | ....... G05B 19/41865 |
| KR | 10-2012-0074329 | A | 7/2012 | |
| KR | 10-2016-0022697 | A | 3/2016 | |
| TW | 533526 | B | 5/2003 | |
| TW | I430331 | B | 3/2014 | |
| WO | WO 2019/163170 | A1 | 8/2019 | |

OTHER PUBLICATIONS

Pomorski "Major Revision Update for SEMI E10 Specification for Definition and Measurement of Equipment Reliability, Availability, and Maintainability (RAM)", 2016, 7 pages, downloaded from https://web.archive.org/web/20161229030452/https://www.semi.org/en/Standards/CTR_031244 (Year: 2016).*

Yurtsever et al, "G r a p h i c a l Manufacturing Monitoring System", 1997, pp. 156-161, downloaded from https://ieeexplore.ieee.org/abstract/document/630725 (Year: 1997).*

Chien et al (Construct a Group OEE for Promoting Tool Group Productivity in Semiconductor Manufacturing), 2007, pp. 1-26, downloaded from https://www.researchgate.net/profile/Jei-Zheng-Wu/publication/245330672_Constructing_promoting_tool_group_productivity_ (Year: 2007).*

Finebi, "Multi-series percent stacked bar chart", 9 pages, 2022, downloaded from https://help.fanruan.com/finebi-en5.1/doc-view-532.html (Year: 2022).*

Taiwanese Patent Gazette in connection with Taiwanese Patent No. 1829121 issued on Jan. 11, 2024 22 pages.

Office Action issued on Jan. 18, 2023 for the corresponding Taiwanese Patent Application No. 111110796, 8 pages.

Office Action dated Apr. 26, 2024 issued in corresponding Korean Patent Application No. 10-2022-0033226. English translation attached, 19 pages.

Office Action issued Mar. 27, 2025 in corresponding Japanese Patent Application No. 2021-151490. English translation attached, 8 pages.

* cited by examiner

Figure 7:
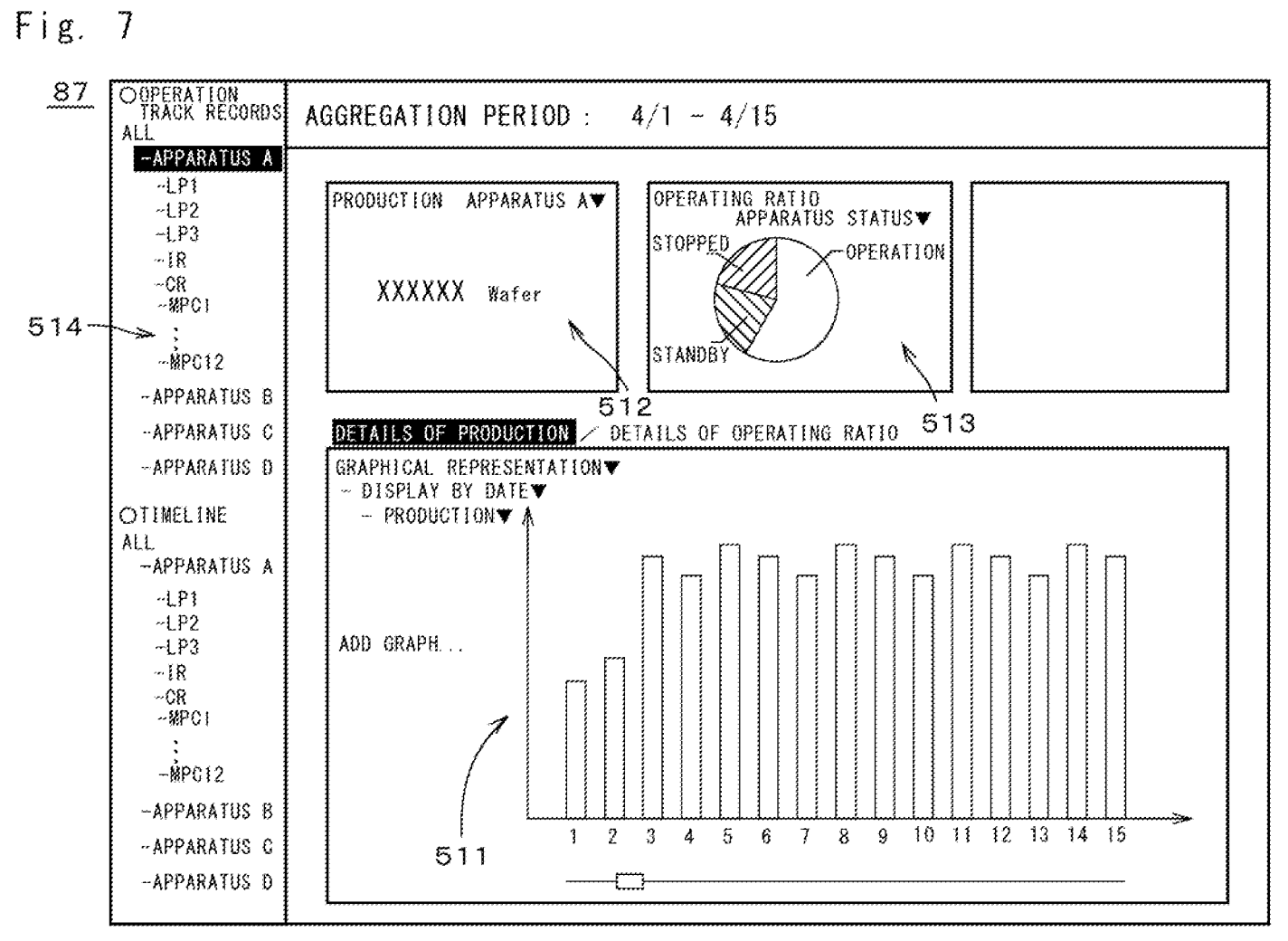

AGGREGATION PERIOD : 4/1 ~ 4/15

○ OPERATION TRACK RECORDS
ALL
─ APPARATUS A
├─ LP1
├─ LP2
├─ LP3
├─ IR
├─ CR
├─ MPC1
┊
└─ MPC12
─ APPARATUS B
─ APPARATUS C
─ APPARATUS D

○ TIMELINE
ALL
─ APPARATUS A
├─ LP1
├─ LP2
├─ LP3
├─ IR
├─ CR
├─ MPC1
┊
└─ MPC12
─ APPARATUS B
─ APPARATUS C
─ APPARATUS D

514

PRODUCTION APPARATUS A ▼

XXXXXX Wafer

512

OPERATING RATIO
APPARATUS STATUS ▼
OPERATION
STOPPED
STANDBY

513

DETAILS OF PRODUCTION ▼ / DETAILS OF OPERATING RATIO ▼

GRAPHICAL REPRESENTATION ▼
~ DISPLAY BY DATE ▼
~ PRODUCTION ▼

ADD GRAPH...

Figure 13:
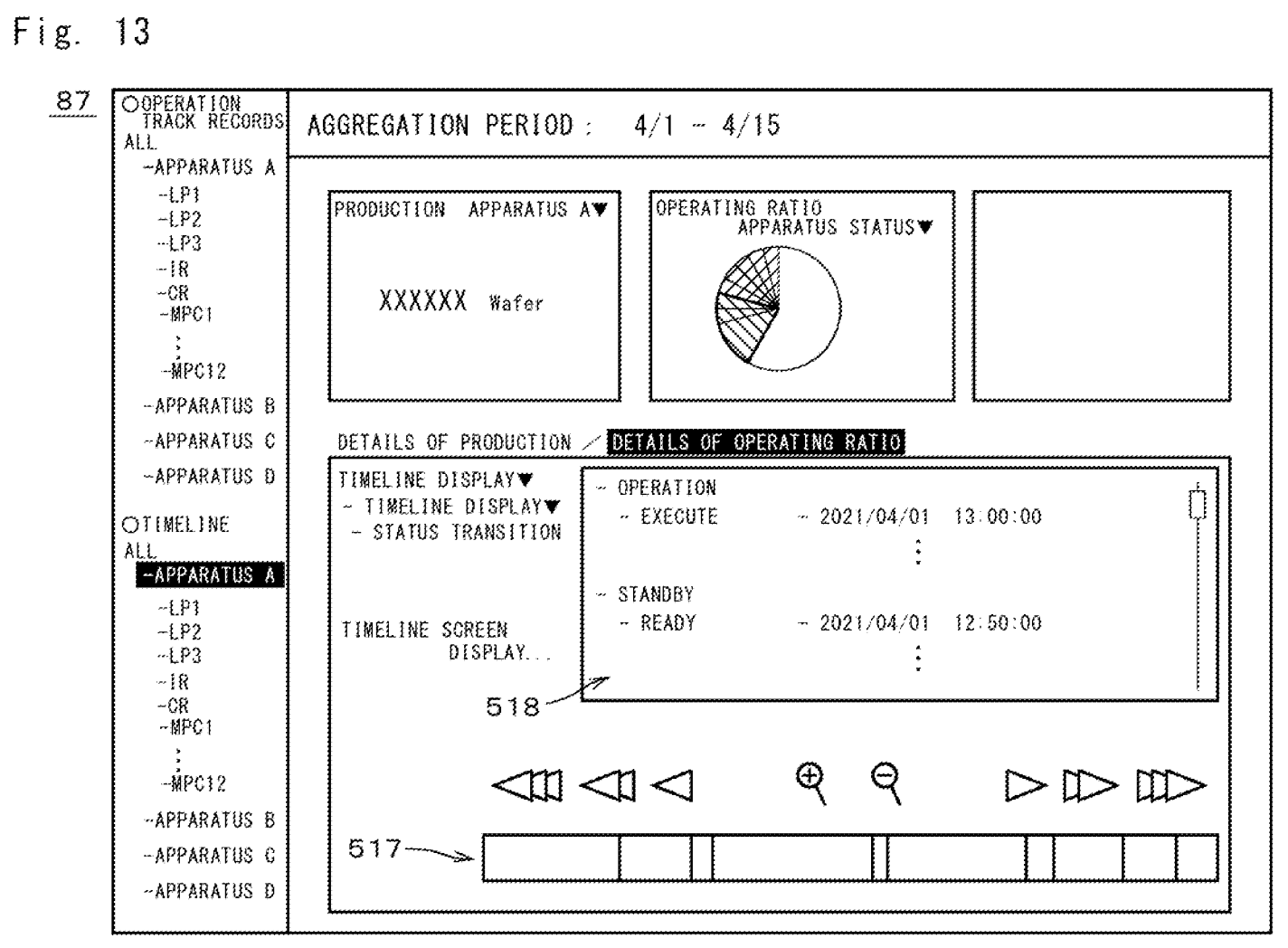

AGGREGATION PERIOD : 4/1 ~ 4/15

OPERATION TRACK RECORDS
ALL
—APPARATUS A
　—LP1
　—LP2
　—LP3
　—IR
　—CR
　—MPC1
　⋮
　—MPC12
—APPARATUS B
—APPARATUS C
—APPARATUS D

PRODUCTION　APPARATUS A▼

XXXXXX Wafer

OPERATING RATIO
　　　APPARATUS STATUS▼

DETAILS OF PRODUCTION／DETAILS OF OPERATING RATIO

TIMELINE DISPLAY▼
　— TIMELINE DISPLAY▼
　— STATUS TRANSITION

TIMELINE SCREEN
　　　DISPLAY...

○TIMELINE
ALL
—APPARATUS A
　—LP1
　—LP2
　—LP3
　—IR
　—CR
　—MPC1
　⋮
　—MPC12
—APPARATUS B
—APPARATUS C
—APPARATUS D

— OPERATION
　— EXECUTE　　　～ 2021/04/01　13:00:00
　　　　　　　　‥‥
　— STANDBY
　— READY　　　～ 2021/04/01　12:50:00
　　　　　　　　‥‥

| OPERATION TRACK RECORDS<br>ALL | SPECIFIED PERIOD<br>OF AGGREGATION<br>(4/1 ~ 4/15) | REFERENCE PERIOD<br>OF AGGREGATION<br>(3/1 ~ 3/15) | DIFFERENCE |
|---|---|---|---|
| ~APPARATUS A | | | |
| ~LP1 | | | |
| ~LP2 | | | |
| ~LP3 | | | |
| ~IR | | | |
| ~CR | | | |
| ~MPC1 | | | |
| : | | | |
| ~MPC12 | | | |
| POWER OFF | **** | **** | **** |
| NOT READY | **** | **** | **** |
| ALARM STOP | **** | **** | **** |
| MAINTENANCE | **** | **** | **** |
| ~APPARATUS B | | | |
| ~APPARATUS C | | | |
| ~APPARATUS D | | | |

87

541

547

542

544

546

543

545

542

543

544

545

546

SUBSTRATE PROCESSING APPARATUS, ANALYSIS METHOD, DISPLAY DEVICE, AND PROGRAM

CROSS-REFERENCE TO RELATED APPLICATION

This application claims priority benefit of Japanese Patent Applications No. JP2021-49992, filed in the Japan Patent Office on Mar. 24, 2021 and No. JP2021-151490, filed in the Japan Patent Office on Sep. 16, 2021, the entire disclosures of which are incorporated herein by reference.

TECHNICAL FIELD

The present invention relates to a substrate processing apparatus and a technique for displaying and analyzing the operational status of the substrate processing apparatus.

BACKGROUND ART

In conventional substrate processing apparatuses for processing semiconductor substrates (hereinafter, simply referred to as "substrates"), for example, FOUPs or the like in which substrates are to be stored are opened via load ports to allow an indexer robot to take substrates out of the FOUPs or the like. The substrates are transferred from the indexer robot to a center robot and then transported by the center robot into one of a plurality of processing units in which a variety of processing is performed on the substrates.

In such substrate processing apparatuses, when an abnormal event has occurred in any of the processing units, yields or the number of substrates to be processed will drop. Japanese Patent Application Laid-open No. 2020-47077 (Document 1) discloses a technique for analyzing time-series data about the result of measuring physical quantities (e.g., temperature) that indicate the statuses of the processing units and identifying a processing unit in which an abnormal even has occurred, and the cause of the abnormal event.

Meanwhile, in the aforementioned substrate processing apparatuses, even if no abnormality is found in any of the operating parts such as the load ports, the indexer robot, the center robot, and the processing units, the apparatuses as a whole may have a reduced number of substrates to be processed when, for example, one operating part stays long in the standby status due to the absence of supply of substrates. In such a case, the cause of the reduction in the number of substrates processed cannot be identified by simply detecting an abnormality in the processing unit as described in Document 1. There is thus demand for users to know the relationship between the result of substrate processing performed by a substrate processing apparatus and the operational statuses of operating parts.

SUMMARY OF INVENTION

The present invention is intended for a substrate processing apparatus, and it is an object of the present invention to easily recognize detailed operational statuses of operating parts in association with the result of substrate processing.

A substrate processing apparatus according to a preferable embodiment of the present invention includes a load port group that is a group of load ports each holding a carrier in which a plurality of substrates are to be housed, a processing unit group that is a group of processing units in which a substrate is to be processed, a transport mechanism that transports a substrate between the load port group and the processing unit group, an information storage that stores operation information, the operation information being information regarding operations of an operating part group of operating parts that include the load port group, the processing unit group, and the transport mechanism, an information display, and a display controller that displays the operation information in a predetermined mode of display on the information display. The operation information includes processing result information indicating a result of substrate processing performed by the substrate processing apparatus, and operational status information indicating a temporal breakdown of an operational status of the substrate processing apparatus and a temporal breakdown of an operational status of each operating part included in the operating part group. The operational status of each of the substrate processing apparatus and the operating parts is hierarchically classified into a plurality of broadly classified operational statuses according to a large classification and into a plurality of specifically classified operational statuses obtained by further classifying the plurality of broadly classified operational statuses. The display controller displays the processing result information on the information display while arranging the processing result information according to an arrangement item selected from among a predetermined arrangement item group that includes an arbitrary operating period of the substrate processing apparatus. The display controller classifies the operational status information into the plurality of broadly classified operational statuses and into the plurality of specifically classified operational statuses and displays the operational status information that has been classified on the information display while arranging the operational status information according to an arrangement item selected from among the arrangement item group.

According to the present invention, it is possible to easily recognize the detailed operational statuses of the operating parts in association with the result of substrate processing.

Preferably, when classifying the operational status information into the broadly classified operational statuses and displaying the operational status information that has been classified on the information display while arranging the operational status information according to the arrangement item, the display controller displays the operational status information in a first graph in which the plurality of broadly classified operational statuses are divided by color. When classifying the operational status information into the plurality of specifically classified operational statuses and displaying the operational status information that has been classified on the information display while arranging the operational status information according to the arrangement item, the display controller displays the operational status information in a second graph in which the plurality of specifically classified operational statuses are divided by color and in which a plurality of specifically classified operational statuses that belong to one broadly classified operational status are displayed in colors akin to a color of the one broadly classified operational status in the first graph.

Preferably, the operational status information includes a time stamp that is associated with the operational status of each operating part and that indicates a starting point and an endpoint of the operational status. The display controller provides a timeline display that indicates the operational status in time sequence on the information display.

Preferably, the display controller displays the operational status information regarding the operating part group on the information display while arranging the operational status information regarding the operating part group according to types of the operating parts included in the operating part group.

Preferably, the display controller displays the operational status information regarding the load port group on the information display while arranging the operational status information according to the load ports.

Preferably, the display controller displays the operational status information regarding the processing unit group on the information display while arranging the operational status information according to the processing units.

Preferably, the arrangement item group includes at least one item out of the operating period, an operation time zone, an operating day of the week, and a processing recipe as one arrangement item. The display controller is capable of displaying the processing result information on the information display while arranging the processing result information according to the at least one item.

Preferably, the arrangement item group includes at least one item out of the operating period, an operation time zone, and an operating day of the week as one arrangement item. The display controller is capable of displaying the operational status information on the information display while arranging the operational status information according to the at least one item.

Preferably, reference processing result information is prepared in advance, the reference processing result information being the processing result information that is collected during a predetermined reference period of aggregation. The display controller provides a display that makes it possible to compare the processing result information and the reference processing result information that are collected during a selected specified period of aggregation.

Preferably, reference operational status information is prepared in advance, the reference operational status information being the operational status information that is collected during a predetermined reference period of aggregation. The display controller displays and compares the operational status information that is collected during a selected specified period of aggregation with the reference operational status information to highlight a broadly classified operational status or a specifically classified operational status that has degraded to a predetermined degree or more in the operational status information collected during the specified period of aggregation.

Preferably, the display controller also displays, on the information display, the processing result information and the operational status information both regarding a different substrate processing apparatus that is identical in configuration to the substrate processing apparatus.

The present invention is also intended for an analysis method for analyzing the operational status of a substrate processing apparatus. The analysis method according to a preferable embodiment of the present invention includes a) causing the substrate processing apparatus according to claim 1 to display the processing result information on the information display while arranging the processing result information according to an arbitrary operating period of the substrate processing apparatus, b) classifying the operational status information into the plurality of broadly classified operational statuses and displaying the operational status information that has been classified on the information display while arranging the operational status information according to the operating period, c) classifying one broadly classified operational status that is presumed to be a cause of degradation in processing result among the plurality of broadly classified operational statuses, into the plurality of specifically classified operational statuses and displaying the one broadly classified operational status that has been classified on the information display, and d) focusing on one specifically classified operational status that is presumed to be a cause of degradation in processing result among the plurality of specifically classified operational statuses, selecting a related operating part group that is a group of operating parts relating to the one specifically classified operational status from among the operating part group, and providing, on the information display, a timeline display that indicates the operational status of the substrate processing apparatus in time sequence and a timeline display that indicates an operational status of each operating part included in the related operating part group in time sequence.

The present invention is also intended for a display device for displaying an operational status of a substrate processing apparatus that includes a load port group that is a group of load ports each holding a carrier in which a plurality of substrates are to be stored, a processing unit group that is a group of processing units in which a substrate is to be processed, and a transport mechanism that transports a substrate between the load port group and the processing unit group. The display device according to a preferable embodiment of the present invention includes an information display, and a display controller that displays operation information in a predetermined mode of display on the information display, the operation information being information regarding operations of an operating part group of operating parts that include the load port group, the processing unit group, and the transport mechanism. The operation information includes processing result information indicating a result of substrate processing performed by the substrate processing apparatus, and operational status information indicating a temporal breakdown of the operational status of the substrate processing apparatus and a temporal breakdown of an operational status of each operating part included in the operating part group. The operational status of each of the substrate processing apparatus and the operating parts is hierarchically classified into a plurality of broadly classified operational statuses according to a large classification and into a plurality of specifically classified operational statuses obtained by further classifying the plurality of broadly classified operational statuses. The display controller displays the processing result information on the information display while arranging the processing result information according to an arrangement item selected from among a predetermined arrangement item group that includes an arbitrary operating period of the substrate processing apparatus. The display controller classifies the operational status information into the plurality of broadly classified operational statuses and into the plurality of specifically classified operational statuses and displays the operational status information that has been classified on the information display while arranging the operational status information according to an arrangement item selected from among the arrangement item group.

The present invention is also intended for a program for causing a substrate processing apparatus to display operation information in a predetermined mode of display on an information display, the substrate processing apparatus including a load port group that is a group of load ports each holding a carrier in which a plurality of substrates are to be stored, a processing unit group that is a group of processing units in which a substrate is to be processed, and a transport mechanism that transports a substrate between the load port group and the processing unit group, the operation information being information regarding operations of an operating part group of operating parts that include the load port group, the processing unit group, and the transport group. The operation information includes processing result information indicating a result of substrate processing performed by the substrate processing apparatus, and operational status information indicating a temporal breakdown of an operational status of the substrate processing apparatus and a temporal breakdown of an operational status of each operating part included in the operating part group. The operational status of each of the substrate processing apparatus and the operating parts is hierarchically classified into a plurality of broadly classified operational statuses according to a large classification and into a plurality of specifically classified operational statuses obtained by further classifying the plurality of broadly classified operational statuses. The program according to one preferable embodiment of the present invention is executed by a computer to display the processing result information on the information display while arranging the processing result information according to an arrangement item selected from among a predetermined arrangement item group that includes an arbitrary operating period of the substrate processing apparatus, and to classify the operational status information into the plurality of broadly classified operational statuses and into the plurality of specifically classified operational statuses and display the operational status information that has been classified on the information display while arranging the operational status information according to an arrangement item selected from among the arrangement item group.

These and other objects, features, aspects and advantages of the present invention will become more apparent from the following detailed description of the present invention when taken in conjunction with the accompanying drawings.

BRIEF DESCRIPTION OF DRAWINGS

FIG. 7 is a diagram showing a screen on a display;

FIG. 11 is a diagram showing a screen on the display;

FIG. 12 is a diagram showing a screen on the display;

FIG. 13 is a diagram showing a screen on the display;

FIG. 15 is a diagram showing a screen on the display;

FIG. 17 is a diagram showing a screen on the display;

FIG. 19 is a diagram showing a screen on the display;

FIG. 20 is a diagram showing a screen on the display;

FIG. 28 is a diagram showing a screen on the display;

DESCRIPTION OF EMBODIMENTS

Figure 1:
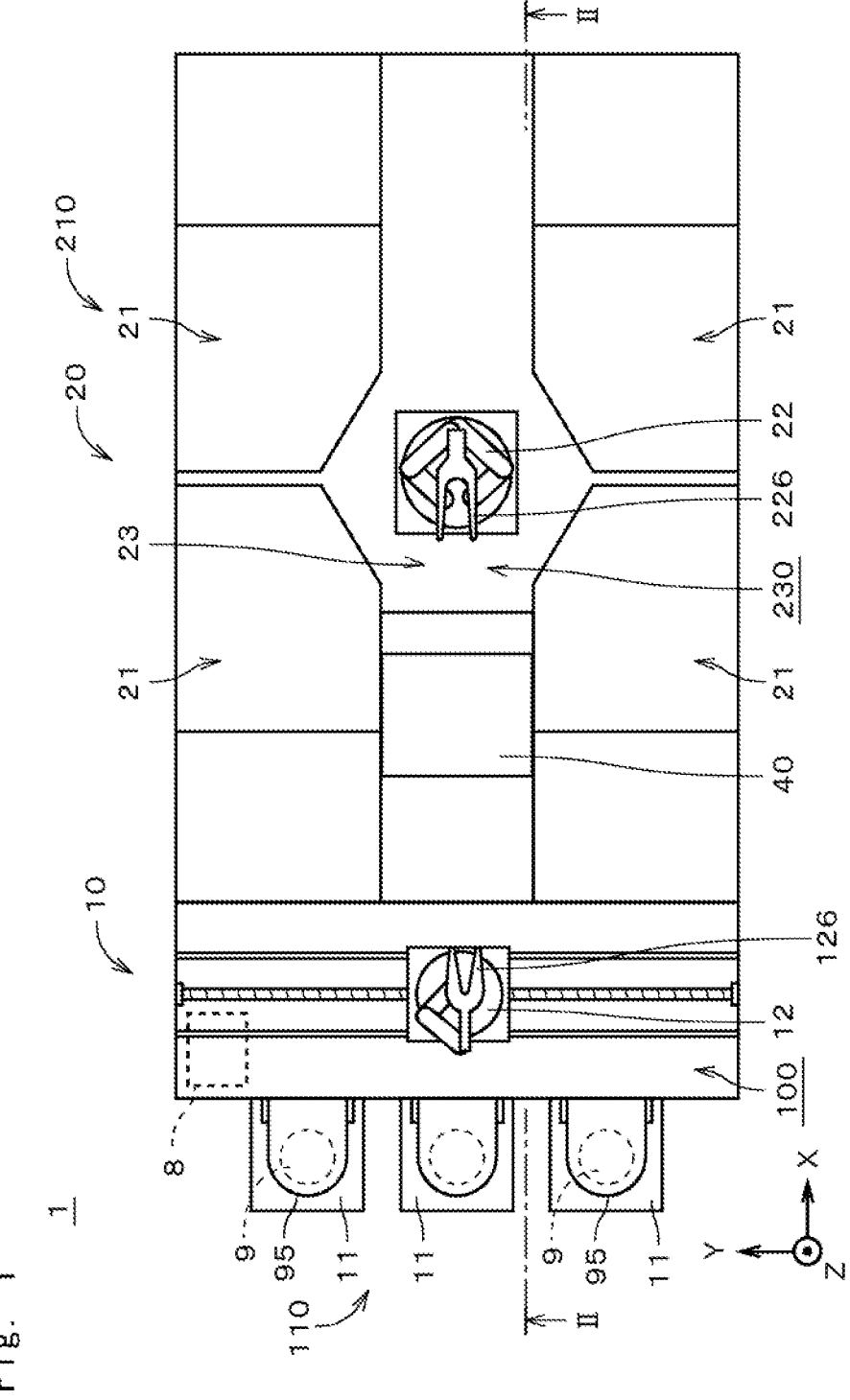
FIG. 1 is a plan view of a substrate processing apparatus according to one embodiment.
Figure 2:
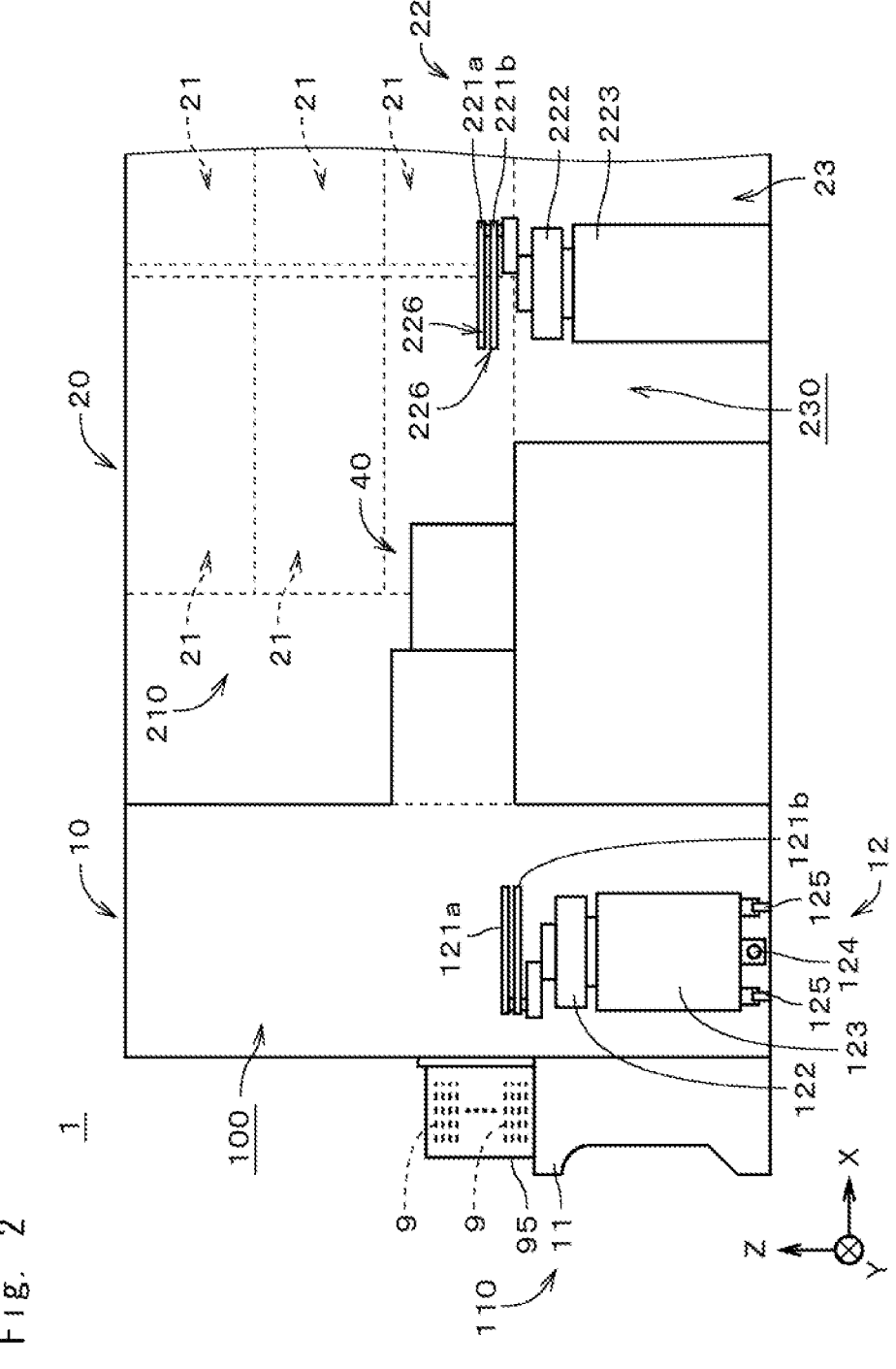
FIG. 2 is a front view showing the inside of the substrate processing apparatus.

FIG. 1 is a plan view of a substrate processing apparatus 1 according to one embodiment of the present invention. FIG. 2 is a diagram showing the substrate processing apparatus 1 as viewed from the line II-II in FIG. 1. Note that each drawing to be referenced hereinafter is appropriately provided with an orthogonal coordinate system XYZ in which the Z axis direction corresponds to the vertical direction (i.e., the up-down direction) and the XY plane corresponds to a horizontal plane. In FIG. 2, part of the substrate processing apparatus 1 on the (+X) side is not shown.

The substrate processing apparatus 1 is an apparatus that continuously performs processing on a plurality of generally disk-shaped semiconductor substrates 9 (hereinafter, simply referred to as "substrates 9"). The substrate processing apparatus 1 performs, for example, liquid processing for supplying a processing liquid to the substrates 9.

The substrate processing apparatus 1 includes a plurality of load ports 11, an indexer block 10, a processing block 20, a placement unit 40, and a computer 8. The indexer block 10 and the processing block 20 are also referred to as an "indexer cell" and a "processing cell," respectively. The indexer block 10 may also be referred to as, for example, an equipment front end module (EFEM) unit. In the example illustrated in FIG. 1, three load ports 11, the indexer block 10, and the processing block 20 are arranged adjacent to one another in the order specified from the (−X) side to the (+X) side. In the following description, load ports 11 are also collectively referred to as a "load port group 110."

The load port group 110, which is a group of load ports 11, is aligned in the Y direction along the side wall on the −X side of the indexer block 10. Each of the load ports 11 is a holder that holds a carrier 95. The carrier 95 is capable of storing a plurality of disk-shaped substrates 9. The carrier 95 may, for example, be a front opening unified pod (FOUP) that stores substrates 9 in its enclosed space. The carrier 95 is, however, not limited to a FOUP and may, for example, be a standard mechanical interface (SMIF) pod. The number of load ports 11 included in the load port group 110 may be one or two or more.

Each load port 11 is also an opening and closing mechanism that opens and closes the carrier 95. The side wall on the −X side of the indexer block 10 has openings and carrier shutters that correspond respectively to the carriers 95 on the load ports 11. The carriers 95 and the carrier shutters are automatically opened and closed when substrates 9 are transported into or out of the carriers 95.

For each load port 11, a carrier 95 that stores a plurality of unprocessed substrates 9 is transported into the load port 11 from outside the substrate processing apparatus 1 and placed on the load port 11 by, for example, an automated guided vehicle (AGV). Processed substrates 9 that have undergone processing performed in the processing block 20 are stored again in the carrier 95 held by the load port 11. The carrier 95 that has stored the processed substrates 9 is transported to the outside of the substrate processing apparatus 1 by, for example, an AGV. That is, the load ports 11 function as substrate collectors that collect unprocessed substrates 9 and processed substrates 9.

The indexer block 10 receives an unprocessed substrate 9 from a carrier 95 and transfers the substrate 9 to the processing block 20. The indexer block 10 also receives a processed substrate 9 transported out of the processing block 20 and transports the substrate 9 into a carrier 95. The indexer block 10 has an indexer robot 12 arranged in its internal space 100, the indexer robot 12 being a robot that transports a substrate 9 into and out of a carrier 95.

The indexer robot 12 includes two transport arms 121a and 121b, an arm stage 122, and a movable mount 23. The two transport arms 121a and 121b are mounted on the arm stage 122. The movable mount 23 has screw-threaded engagement with a ball screw 124 that extends in parallel with the direction of alignment of the load ports 11 (i.e., in the Y direction), and is provided slidably along two guide rails 125. When the ball screw 124 is rotated by a rotary motor (not shown), the indexer robot 12 as a whole including the movable mount 23 moves horizontally in the Y direction.

The arm stage 122 is mounted on the movable mount 23. The movable mount 23 includes a motor (not shown) that rotates the arm stage 122 about a rotation axis pointing in the up-down direction (i.e., Z direction) and a motor (not shown) that moves the arm stage 122 in the up-down direction. The transport arms 121a and 121b are arranged vertically apart from each other on the arm stage 122.

The transport arms 121a and 121b are each provided with a generally U-shaped hand 126 at their tip as viewed in plan view. Each hand 126 includes, for example, a base that expands in the width direction and two lugs that extend in generally parallel with the longitudinal direction perpendicular to the width direction from both ends in the width direction of the base. Each of the transport arms 121a and 121b supports the lower surface of a single substrate 9 with its hand 126. Each hand 126 is provided with a clamp mechanism (not shown) and fixes the position of the substrate 9 relative to the hand 126 with high positioning accuracy. For example, the clamp mechanism may be configured by a plurality of projections or the like that come in contact with the side edge of a substrate 9 and mechanically limits the position of the substrate 9, or may be configured by a plurality of suction ports that absorb the lower surface of a substrate 9.

The transport arms 121a and 121b move independently of each other in the horizontal direction (i.e., in the radial direction about the rotation axis of the arm stage 122), as a result of an articulated mechanism being expanded and contracted by a drive mechanism (not shown) included in the arm stage 122. In other words, the hands 126 of the indexer robot 12 are capable of back-and-forth movement, up-and-down movement, and rotation. Note that the number of transport arms of the indexer robot 12 may be one or three or more.

The indexer robot 12 is a transport robot that controls the transport arms 121a and 121b, each holding a substrate 9 with their hand 126, to individually access the placement unit 40 and the carriers 95 placed on the load ports 11 and transports substrates 9 between the placement unit 40 and the carriers 95. The aforementioned movement mechanism of the indexer robot 12 is not limited to the one described in the aforementioned example, and may be any other mechanism. For example, a belt feed mechanism using a pulley and a timing belt may be adopted as a mechanism for moving the transport arms 121a and 121b in the up-down direction.

The processing block 20 includes a transport path 23 used to transport substrates 9, and a plurality of processing units 21 arranged around the transport path 23. In the example illustrated in FIG. 1, the transport path 23 extends in the X direction at the center in the Y direction of the processing block 20. The transport path 23 has a center robot 22 arranged in its internal space 230, the center robot 22 being a robot that transports a substrate 9 into and out of each processing unit 21.

The center robot 22 includes two transport arms 221a and 221b, an arm stage 222, and a mount 223. The two transport arms 221a and 221b are mounted on the arm stage 222. The mount 223 is fixed to the frame of the processing block 20. Thus, the mount 223 of the center robot 22 moves in neither the horizontal direction nor the up-down direction. Alternatively, the mount 223 of the center robot 22 may be configured so as to be movable in the horizontal direction.

The arm stage 222 is mounted on the mount 223. The mount 223 includes a motor (not shown) that rotates the arm stage 222 about a rotation axis pointing in the up-down direction, and a motor (not shown) that moves the arm stage 222 in the up-down direction. The transport arms 221a and 221b are arranged vertically away from each other on the arm stage 222.

The transport arms 221a and 221b are each provided with a generally U-shaped hand 226 at their tip as viewed in plan view. Each hand 226 includes, for example, a base that expands in the width direction, and two lugs that extend in generally parallel with the longitudinal direction perpendicular to the width direction from both ends in the width direction of the base. Each of the transport arms 221a and 221b supports the lower surface of a single substrate 9 with its hand 226. Each hand 226 is provided with a clamp mechanism (not shown) and fixes the position of a substrate 9 relative to the hand 226 with high positioning accuracy. For example, the clamp mechanism may be configured by a plurality of projections or the like that come in contact with the side edge of a substrate 9 and mechanically limit the position of the substrate 9, or may be configured by a plurality of suction ports that absorb the lower surface of a substrate 9.

The transport arms 221a and 221b move independently of each other in the horizontal direction (i.e., in the radial direction about the rotation axis of the arm stage 222), as a result of an articulated mechanism being expanded and contracted by a drive mechanism (not shown) included in the arm stage 222. In other words, the hands 226 of the center robot 22 are capable of back-and-forth movement, up-and-down movement, and rotation. Note that the number of transport arms of the center robot 22 may be one or three or more.

The center robot 22 is a transport robot that controls the transport arms 221a and 221b, each holding a substrate 9 with their hand 226, to individually access the placement unit 40 and the processing units 21 so as to transport substrates 9 between the placement unit 40 and the processing units 21. The aforementioned movement mechanism of the center robot 22 is not limited to the one described in the aforementioned example, and may be any other mechanism. For example, a belt feed mechanism using a pulley and a timing belt may be adopted as a mechanism for moving the transport arms 221a and 221b in the up-down direction.

Each processing unit 21 performs predetermined processing on substrates 9. In the example illustrated in FIGS. 1 and 2, the processing block 20 includes 12 processing units 21. Specifically, four sets of three processing units 21 stacked in the Z direction are arranged around the center robot 22 as viewed in plan view. In the following description, the processing units 21 are also collectively referred to as a "processing unit group 210." The number of processing units 21 included in the processing unit group 210 may be changed to any value within the range of values greater than 1.

The placement unit 40 is provided at the joint between the indexer block 10 and the processing block 20. As described previously, the indexer robot 12 and the center robot 22 are accessible to the placement unit 40. The placement unit 40 is connected to the processing unit group 210, which is a group of processing units 21, through the transport path 23 in which the center robot 22 is arranged.

The indexer robot 12 places an unprocessed substrate 9 transported out of a carrier 95 on the placement unit 40. The center robot 22 transports an unprocessed substrate 9 out from the placement unit 40 into a processing unit 21. The center robot 22 also places a processed substrate 9 transported out of a processing unit 21 on the placement unit 40. The indexer robot 12 transports a processed substrate 9 out from the placement unit 40 into a carrier 95. In other words, the indexer robot 12 and the center robot 22 form a transport mechanism that transports substrates 9 between the load port group 110 and the processing unit group 210. The placement unit 40 temporarily holds unprocessed substrates 9 that are transferred from the indexer robot 12 to the center robot 22 and processed substrates 9 that are transferred from the center robot 22 to the indexer robot 12

Figure 3:
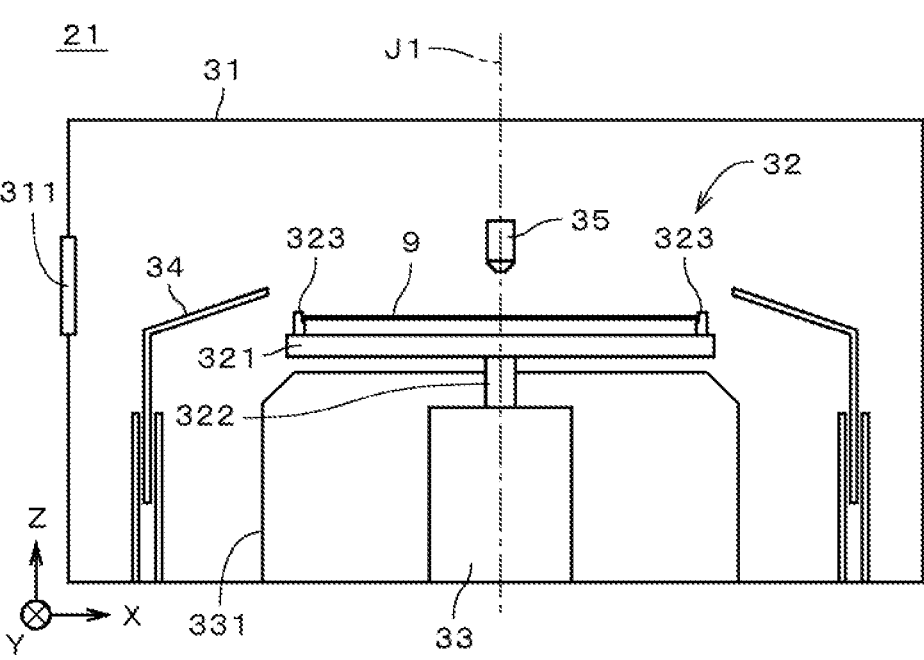
FIG. 3 is a diagram showing one example of a processing unit.

FIG. 3 is a diagram showing one example of a processing unit 21. The processing unit 21 includes a housing 31, a substrate holder 32, a substrate rotation mechanism 33, a cup part 34, and a processing nozzle 35. The substrate holder 32, the substrate rotation mechanism 33, the cup part 34, and the processing nozzle 35 are housed inside the housing 31. The side wall of the housing 31 has an opening 311 for transporting a substrate 9 in by the center robot 22 (see FIGS. 1 and 2). The opening 311 is capable of being opened and closed; it is opened during transport in and out of substrates 9 and closed during processing of the substrates 9. The processing unit 21 performs, for example, liquid processing for supplying a processing liquid to substrates 9.

In the example illustrated in FIG. 3, the substrate holder 32 is a mechanical chuck that holds a substrate 9 in a horizontal position. The substrate holder 32 includes a base 321, a shaft 322, and a plurality of chuck pins 323. The base 321 is a generally disk-shaped member having a rotation axis J1 pointing in the up-down direction as its center. The following description is given on the assumption that the up-down direction in FIG. 3 agrees with the aforementioned Z direction, but the up-down direction in FIG. 3 does not necessarily have to agree with the Z direction. The shaft 322 is a generally cylindrical or columnar member having the rotation axis J1 as its center. The shaft 322 extends downward from the lower surface of the base 321 and is connected to the substrate rotation mechanism 33.

The plurality of (e.g., six) chuck pins 323 are provided upright on the upper surface of the base 321. The chuck pins 323 are circularly arranged on an outer peripheral portion of the upper surface of the base 321. The chuck pins 323 are in direct contact with the outer peripheral portion of a substrate 9 and mechanically hold the outer peripheral portion of the substrate 9. When a substrate 9 is held by the chuck pins 323, the upper surface of the base 321 faces the lower surface of the substrate 9 in the up-down direction while being spaced downward from the lower surface of the substrate 9.

The substrate rotation mechanism 33 rotates the substrate holder 32 about the rotation axis J1 so as to rotate a substrate 9 held by the substrate holder 32. The substrate rotation mechanism 33 may, for example, be an electric motor connected to the shaft 322 of the substrate holder 32. Alternatively, the substrate rotation mechanism 33 may be any rotation mechanism other than an electric motor. The substrate rotation mechanism 33 is housed inside a cover 331 provided below the substrate holder 32.

The processing nozzle 35 ejects a processing liquid toward the upper surface of a substrate 9 from above the substrate 9. In FIG. 3, a configuration that supports the processing nozzle 35 above a substrate 9 is not shown. The cup part 34 is a generally cylindrical member that surrounds all around the circumference of the substrate holder 32. The cup part 34 is a liquid receiver that receives a processing liquid or the like dispersed throughout the surroundings from a rotating substrate 9. The cup part 34 is movable in the up-down direction by a cup elevating mechanism (not shown). When a substrate 9 is processed, the cup part 34 is arranged at a position facing the side edge of the substrate 9 in the radial direction about the rotation axis J1 (hereinafter, also simply referred to as the "radial direction") as illustrated in FIG. 3. When a substrate 9 is passed between the substrate holder 32 and the hand 226 of the center robot 22, the cup part 34 moves downward from the position illustrated in FIG. 3.

Figure 4:
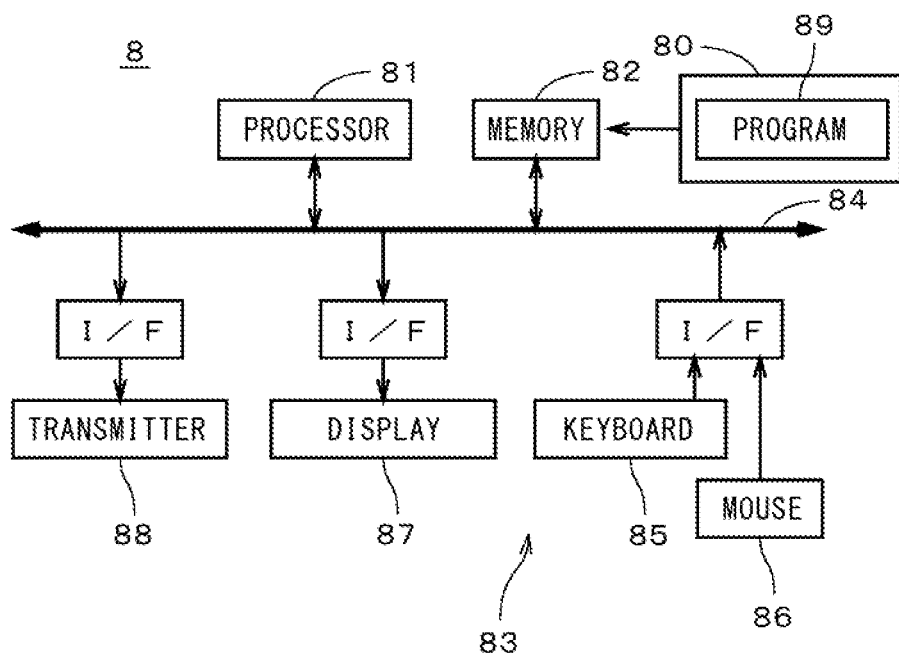
FIG. 4 is a diagram showing a configuration of a computer.

FIG. 4 is a diagram showing a configuration of the computer 8. The computer 8 is an ordinary computer that includes a processor 81, a memory 82, an input/output part 83, and a bus 84. The bus 84 is a signal circuit that connects the processor 81, the memory 82, and the input/output part 83. The memory 82 stores various types of information. For example, the memory 82 reads out and stores a program 89 that is stored in advance in a storage medium 80. The storage medium 80 may, for example, be a USB memory or a CD-ROM. The processor 81 executes a variety of processing (e.g., numerical calculation) using the memory 82 or other constituent elements in accordance with the aforementioned program 89 or any other data stored in the memory 82. The input/output part 83 includes a keyboard 85 and a mouse 86 that accept input from an operator, a display 87 that displays output or the like from the processor 81, and a transmitter 88 that transmits output or the like from the processor 81.

Figure 5:
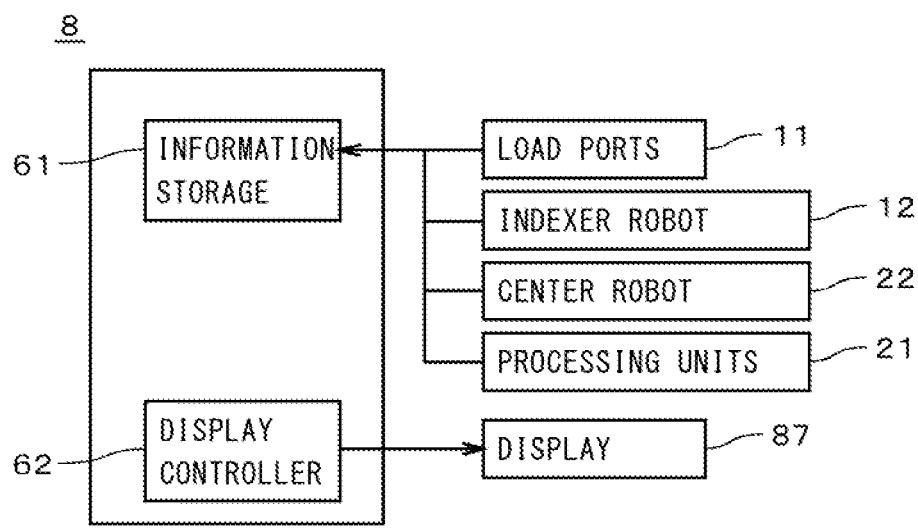
FIG. 5 is a block diagram showing functions implemented by the computer.

FIG. 5 is a block diagram showing functions implemented by the computer 8 executing the aforementioned program 89. The substrate processing apparatus 1 includes an information storage 61 and a display controller 62 as the functions implemented by the computer 8. The information storage 61 is mainly implemented by the memory 82 and stores various types of information such as operation information, which will be described later. The display controller 62 is mainly implemented by the processor 81. In accordance with input or the like from the keyboard 85 and the mouse 86, the display controller 62 extracts information corresponding to the aforementioned input from the operation information stored in the information storage 61 and displays the extracted information in a predetermined mode of display (i.e., format) on the display 87, which serves as an information display.

Figure 6:
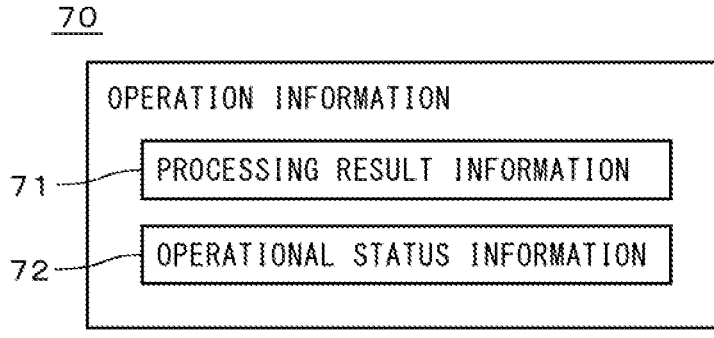
FIG. 6 is a diagram showing operation information.

The operation information stored in the information storage 61 is information regarding operations of an operating part group that is a group of operating units including the load port group 110, the transport mechanism (i.e., the indexer robot 12 and the center robot 22), and the processing unit group 210, which are described above. The operating part group may also include, as the operating parts, constituent elements other than the load port group 110, the transport mechanism, and the processing unit group 210 (e.g., a chemical cabinet that supplies a processing liquid to the processing unit group 210). As illustrated in FIG. 6, operation information 70 includes processing result information 71 and operational status information 72. The processing result information 71 indicates the result of the processing of substrates 9 by the substrate processing apparatus 1. The operational status information 72 is information indicating a temporal breakdown of the operational status of the substrate processing apparatus 1 and temporal breakdowns of the operational statuses of the operating parts included in the operating part group. The information storage 61 acquires an electrical signal such as a command signal from an operation controller that controls operations of the operating part group, and generates and stores the processing result information 71 and the operational status information 72 in accordance with the command signal or other signals. The operation controller is implemented by the aforementioned computer 8.

The processing result information 71 includes, for example, the number of substrates 9 processed by the substrate processing apparatus 1 during a predetermined period of time, the number of normally processed substrates 9, and the number of abnormally processed substrates 9. The predetermined period of time may, for example, be one day, one week, or one month. The processing result information 71 may further include any variety of information other than the information described above. The processing result information 71 may include the number of substrates 9 processed according to each recipe used in the substrate processing apparatus 1, the number of substrates 9 that can be processed for each processable period of time, the number of substrates 9 that can be processed by each processing unit 21, the number of substrates 9 that have been checked by alarm, and the amount of the processing liquid used in the substrate processing apparatus 1. The processing result information 71 is capable of being acquired by any of commonly known variety of measures for substrate processing. For example, the number of substrates 9 processed is capable of being acquired by counting the number of substrates 9 that have been transported into the substrate processing apparatus 1 and then transported out after processing.

The operational status of each of the substrate processing apparatus 1 and the operating part group, the temporal breakdowns of which are indicated by the operational status information 72, is hierarchically classified into a plurality of broadly classified operational statuses according to a large classification and into a plurality of specifically classified operational statuses obtained by further classifying the broadly classified operational statuses.

Table 1 shows one example of the hierarchical classifications of the operational statuses. In the example shown in Table 1, the broadly classified operational statuses include three operational statuses, namely "Stopped," "Standby," and "Operation." In the present embodiment, the operational status of each of the substrate processing apparatus 1, the load ports 11, the indexer robot 12, the center robot 22, and the processing units 21 is hierarchically classified as shown in Table 1.

TABLE 1

| Broadly Classified Operational Status | Specifically Classified Operational Status |
|---|---|
| Stopped | Power Off |
| | Not Ready |
| | Alarm Stop |
| | Maintenance |
| | Recovery |
| Standby | Ready |
| | Operator Stop |
| | Prepare |
| Operation | Execute |

The "Stopped" status is classified into five specifically classified operational statuses, namely "Power Off," "Not Ready," "Alarm Stop," "Maintenance," and "Recovery." "Power Off" indicates, for example, the status in which the power sources of the substrate processing apparatus 1 and the operating parts are in the OFF state. "Not Ready" indicates the status in which the substrate processing apparatus 1 and the operating parts are not ready for processing of substrates 9. "Alarm Stop" indicates the status in which the processing of substrates 9 is stopped by alarm. "Maintenance" indicates the status in which the substrate processing apparatus 1 has stopped the processing of substrates 9 due to the occurrence of an abnormal event and requires a recovery operation by an operator. "Recovery" indicates the status in which the substrate processing apparatus 1 is in recovery operation by an operator.

The "Standby" status is classified into three specifically classified operational statuses, namely "Ready," "Operator Stop," and "Prepare." "Ready" indicates the status in which the substrate processing apparatus 1 is in a state of being able to process substrates 9 and waits for an instruction to process substrates 9. "Operator Stop" indicates the status in which the processing of substrates 9 is suspended due to a stop instruction from an operator. "Prepare" indicates the status in which the substrate processing apparatus 1 is in the process of preparing for processing of substrates 9 and will automatically start substrate processing after the completion of the preparation process. The "Operation" status includes one specifically classified operational status, namely "Execute." "Execute" indicates the status in which substrates 9 are processed normally. Alternatively, the "Operation" status may also be classified into a plurality of specifically classified operational statuses, like the "Stopped" status and the "Standby" status.

The operational status information 72 can be acquired by any commonly known variety of measures concerning substrate processing, such as collecting signals from a controller that controls each operating part. Note that the aforementioned hierarchical classifications of the operational statuses may be modified in various way. For example, the broadly classified operational statuses and the specifically classified operational statuses may be classified according to any other classification standard different from the standard shown in Table 1. Moreover, the substrate processing apparatus 1 and the operating parts do not necessary have to use a common method of classification into broadly classified operational statuses and specifically classified operational statuses, and may use different methods of classification. The operational status information 72 may also include information other than the broadly classified operational statuses and the specifically classified operational statuses. For example, the specifically classified operational statuses may be further classified into a plurality of more specifically classified operational statuses. As another alternative, the operational status information 72 may also include sub-data such as the number of times alarm has occurred in the substrate processing apparatus 1 and the length of stay of substrates 9 in the processing block 20.

The display controller 62 displays the processing result information 71 on the display 87 while arranging the processing result information 71 according to one or more arrangement items selected from among a predetermined arrangement item group. The arrangement item group includes an arbitrary operating period of the substrate processing apparatus 1 as one arrangement item. The operating period may, for example, be a date on which the substrate processing apparatus 1 has processed substrates 9 (hereinafter, also referred to as the "processing date"). The operating period may also be a week, a month, and/or a year during which the substrate processing apparatus 1 has processed substrates 9. The arrangement item group may include a variety of arrangement items other than the operating period (e.g., recipe type). The display controller 62 displays, for example, the number of substrates 9 processed by the substrate processing apparatus 1 on the display 87 while arranging information according to the processing dates, which serve as one arrangement item.

FIG. 7 is a diagram showing one example of a screen on the display 87. A graph 511 in FIG. 7 is a bar graph that shows the number of substrates 9 (i.e., details of the production) according to the processing dates of the substrate processing apparatus 1 during a predetermined period of time (from April 1 to 15). The predetermined period of time (hereinafter, also referred to as the "specified period of aggregation") is displayed on the upper part of the display 87. The specified period of aggregation may be changed by, for example, input from an operator. The horizontal axis of the graph 511 indicates the processing date, which serves as one arrangement item, and the vertical axis indicates the number of substrates 9 processed. A window 512 on the upper left of the graph 511 displays a total number of substrates 9 processed during the specified period of aggregation (i.e., total production). As shown in FIG. 7, the aforementioned arrangement item serves as a parameter that is used as a reference (i.e., the axis of the graph) in the case of displaying the processing result information 71, and the processing result information 71 to be analyzed is divided by arrangement item (i.e., arranged according to the arrangement items) and displayed on the display 87. That is, the arrangement item also serves as an analysis item for use in analyzing the processing result information 71. As will be described later, the arrangement item also serves as a parameter that is used as a reference (i.e., the axis of the graph) in the case of displaying the operational status information 72, and also serves as an analysis item for analyzing the operational status information 72.

A graph 513 in FIG. 7 is a pie chart that shows the operational status information 72 of the substrate processing apparatus 1. In the graph 513, the operational status of the substrate processing apparatus 1 during the specified period of aggregation (April 1 to 15) is displayed while being classified into the broadly classified operational statuses (i.e., "Operation," "Standby," and "Stopped"). In other words, the graph 513 shows a breakdown of the operational status of the substrate processing apparatus 1 during the specified period of aggregation.

The display controller 62 is also capable of displaying, on the display 87, the processing result information 71 and the operational status information 72 both regarding another substrate processing apparatus 1 that is identical in configuration to the substrate processing apparatus 1 described above. The processing result information 71 and the operational status information 72 regarding the other substrate processing apparatus 1 may be stored in the information storage 61 of the computer 8 of the substrate processing apparatus 1 illustrated in FIG. 1, or may be stored in a computer of the other substrate processing apparatus 1 that is accessible by the computer 8.

The display controller 62 may be implemented by a common computer connected to a plurality of substrate processing apparatuses 1, and may display the processing result information 71 and the operational status information 72 regarding each substrate processing apparatus 1, stored in the information storage 61 of the substrate processing apparatus 1, on the display of the common computer. In this case, for example, the common computer and the substrate processing apparatuses 1 configure a substrate processing system. Note that the aforementioned information storage 61 may also be implemented by the common computer, and the processing result information 71 and the operational status information 72 regarding each substrate processing apparatus 1 may be stored in the information storage 61 of the common computer.

A switching window 514 on the left side in FIG. 7 displays the names of a plurality of substrate processing apparatuses 1, namely "Apparatus A," "Apparatus B," "Apparatus C," and "Apparatus D," and for example, by clicking one of the names, the processing result information 71 and the operational status information 72 regarding a corresponding substrate processing apparatus 1 are displayed on the display 87. In FIG. 7, the processing result information 71 and the operational status information 72 regarding the substrate processing apparatus 1 that corresponds to "Apparatus A" indicated by hollow characters are displayed. In this way, in the case where the processing result information 71 and the operational status information 72 regarding a plurality of substrate processing apparatuses 1 are displayed on the display 87, the aforementioned arrangement item group also includes the names of the substrate processing apparatuses 1.

Upon a click of "All" that collectively indicates the apparatuses A to D in the switching window 514 on the left side in FIG. 7, the processing result information 71 and the operational status information 72 regarding the four substrate processing apparatuses 1 (i.e., the apparatuses A to D) are displayed on the display 87. Specifically, the graph 511 shows a total of the numbers of substrates processed by the four substrate processing apparatuses 1 according to processing dates during the specified period of aggregation (April 1 to 15). The graph 513 shows breakdowns of the operational statuses of the four substrate processing apparatuses 1.

The display controller 62 is also capable of displaying, on the display 87, the processing result information 71 and the operational status information 72 regarding each of the three load ports 11, the indexer robot 12, the center robot 22, and the 12 processing units 21 (see FIGS. 1 and 2), which are the operating parts of the substrate processing apparatus 1. The switching window 514 in FIG. 7 displays the names of the operating parts (LP1 to LP3, IR, CR, and MPC1 to MPC12) of the currently selected substrate processing apparatus 1, namely the apparatus A, and for example upon a click of any name, the processing result information 71 and the operational status information 72 regarding the corresponding operating part is displayed on the display 87. Note that the processing result information 71 and the operational status information 72 regarding each operating part of the apparatuses B to D can also be displayed in the same manner.

Figure 8:
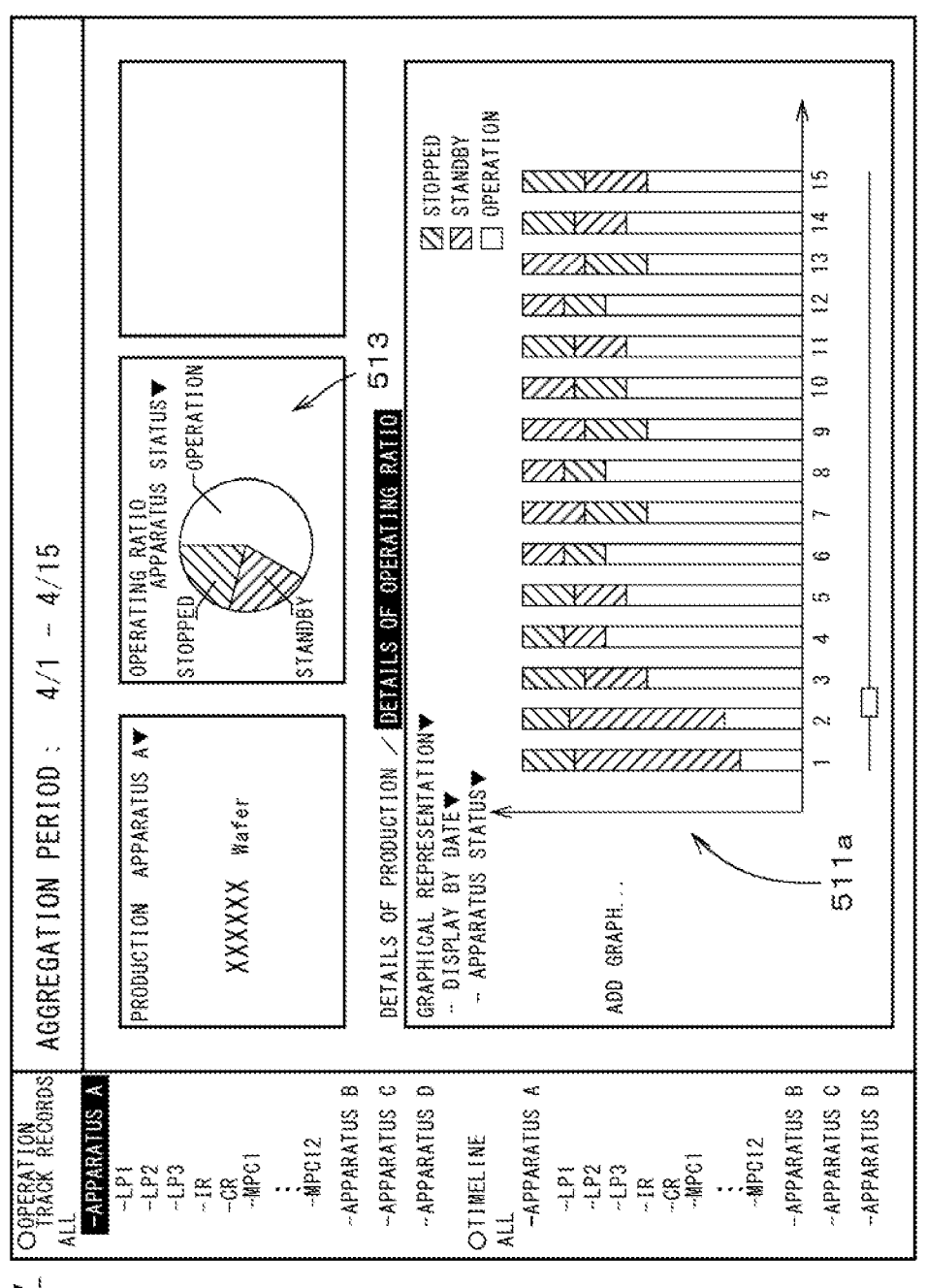
FIG. 8 is a diagram showing a screen on the display.

FIG. 8 shows the display in which the graph 511 in FIG. 7 is changed to a stacked vertical bar graph 511a (hereinafter, also simply referred to as the "graph 511a") that shows the breakdown of the operational status of the substrate processing apparatus 1 according to the processing dates (i.e., details of the operating ratio) during a specified period of aggregation. This change of the graph or other operations is implemented by, for example, the operator operating the mouse 86 or the like to switch a pull-down menu or the like displayed in graphical presentation on the display 87. Changes of other graphs or other operations described later are also implemented in approximately the same manner. In this way, the display controller 62 is also capable of classifying the operational status information 72 into a plurality of broadly classified operational statuses and displaying the classified operational status information 72 on the display 87 while arranging the operational status information 72 according to the processing dates (i.e., the aforementioned one arrangement item selected from among the arrangement item group). In other words, the operational status information 72 to be analyzed is classified into a plurality of broadly classified operational statuses and divided and displayed by processing date on the display 87. In the graph 511a, for example, the three broadly classified operational statuses, namely "Operation," "Standby," and "Stopped," are displayed in different colors. In FIG. 8, the graph 513 is the same as the graph 513 in FIG. 7 and is colored in the same manner as the graph 511a. Note that the graph 511a may be displayed in graphical representation other than the stacked vertical bar graph illustrated in FIG. 8 (e.g., a stacked horizontal bar graph or a pie chart). The same applies to graphs 511b to 511d and 526 to 528, which will be described later.

Figure 9:
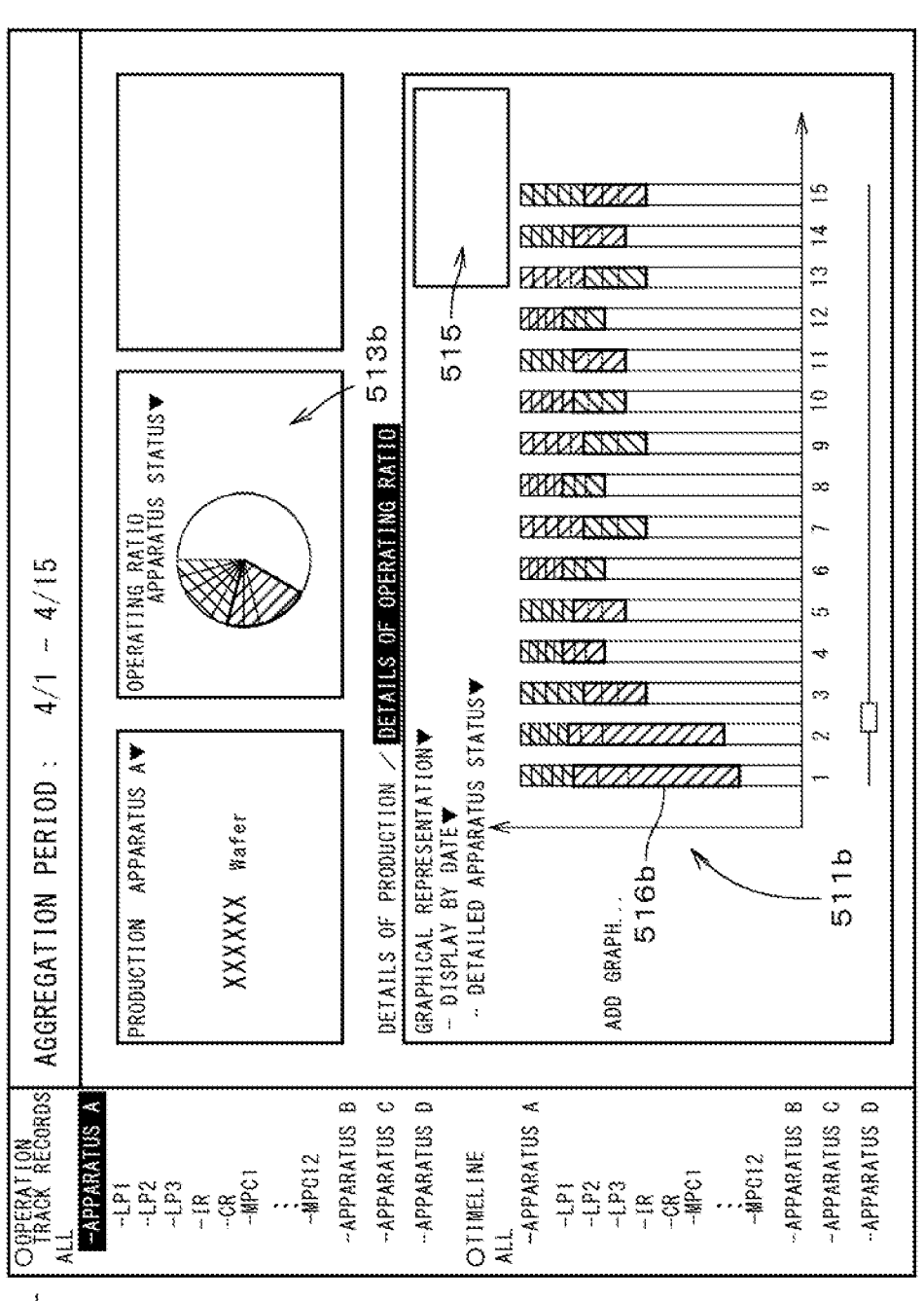
FIG. 9 is a diagram showing a screen on the display.

FIG. 9 shows a screen in which the graph 511a in FIG. 8 is changed into a stacked vertical bar graph 511b (hereinafter, also simply referred to as the "graph 511b") that shows a further detailed breakdown of the operational status of the substrate processing apparatus 1 according to the processing dates during the specified period of aggregation. When the graph 511a and the graph 511b are respectively referred to as a "first graph" and a "second graph," the second graph is obtained by subdividing the breakdown in the first graph. In this way, the display controller 62 is also capable of classifying the operational status information 72 into the specifically classified operational statuses (see Table 1) and displaying the classified operational status information 72 on the display 87 while arranging the operational status information 72 according to the processing dates (i.e., the aforementioned one arrangement item selected from among the arrangement item group). In other words, the operational status information 72 to be analyzed is classified into the specifically classified operational statuses and divided and displayed by processing date on the display 87.

In FIG. 9, the graph 513 in FIG. 8 is also changed to a graph 513b in which the operational status of the substrate processing apparatus 1 during the specified period of aggregation is classified into the specifically classified operational statuses. In FIG. 9, to facilitate understanding of the graphs, the three specifically classified operational statuses included in the broadly classified operational status, "Standby," are enclosed by thick lines in the graphs 511b and 513b. In the actual graph 511b, legends that indicate the specifically classified operational statuses are displayed in a window 515. Similarly, legends that indicate the specifically classified operational statuses are displayed in the same manner in the graph 513b.

Figure 10:
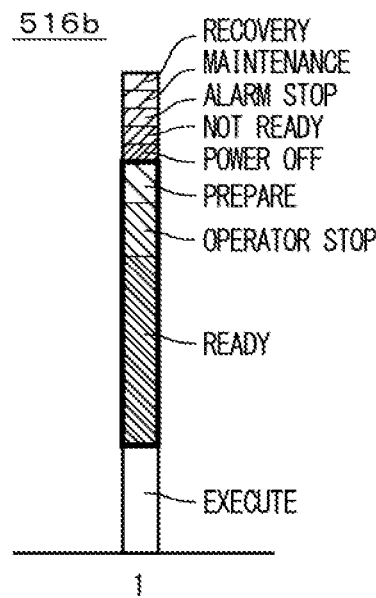
FIG. 10 is a diagram showing one graph element.

FIG. 10 is an enlarged view of a graph element 516b in the left end of the graph 511b in FIG. 9. When the graphs 511a and 511b are displayed in colors, the graph element 516b is preferably divided by color such that the three specifically classified operational statuses corresponding to the broadly classified operational status "Standby" namely "Ready," "Operator Stop," and "Prepare," are displayed in colors akin to the color of "Standby" in the graph 511a (see FIG. 8). It is also preferable that the five specifically classified operational statuses corresponding to the broadly classified operational status "Stopped," namely "Power Off," "Not Ready," "Alarm Stop," "Maintenance," and "Recovery," are preferably displayed in colors akin to the color of "Stopped" in the graph 511a. It is yet more preferable that the specifically classified operational status corresponding to the broadly classified operational status "Operation," namely "Execute," is displayed in a color akin to the color of "Operation" in the graph 511a. This enables the operator to easily recognize the breakdown of the operational status of the substrate processing apparatus 1. In the present embodiment, "colors akin to one color" mean conceptual colors that include similar colors adjacent to each other in the hue circle and colors obtained by changing the tone of one color.

When "Standby" is displayed in green in the graph 511a, "Ready," "Operator Stop," and "Prepare" are displayed in, for example, dark green, middle green, and light green, respectively, in the graph 511b. When "Stopped" is displayed in red in the graph 511a, "Power Off," "Not Ready," "Alarm Stop," "Maintenance," and "Recovery" are displayed in, for example, reddish colors with different shades in the graph 511b. The graph 513b is also displayed in colors in the same manner as the graph 511b.

In the substrate processing apparatus 1, the graph 511 showing the aforementioned number of substrates 9 processed on each processing date (see FIG. 7) and the graph 511a and/or the graph 511b showing the operational status on each processing date (see FIGS. 8 and 9) may be displayed simultaneously on the display 87. As another alternative, the graph 511a showing the operational status classified into broadly classified operational statuses on each processing date, and the graph 511b showing the operational status classified into specifically classified operational statuses on each processing date may be displayed simultaneously on the display 87.

Figure 11:
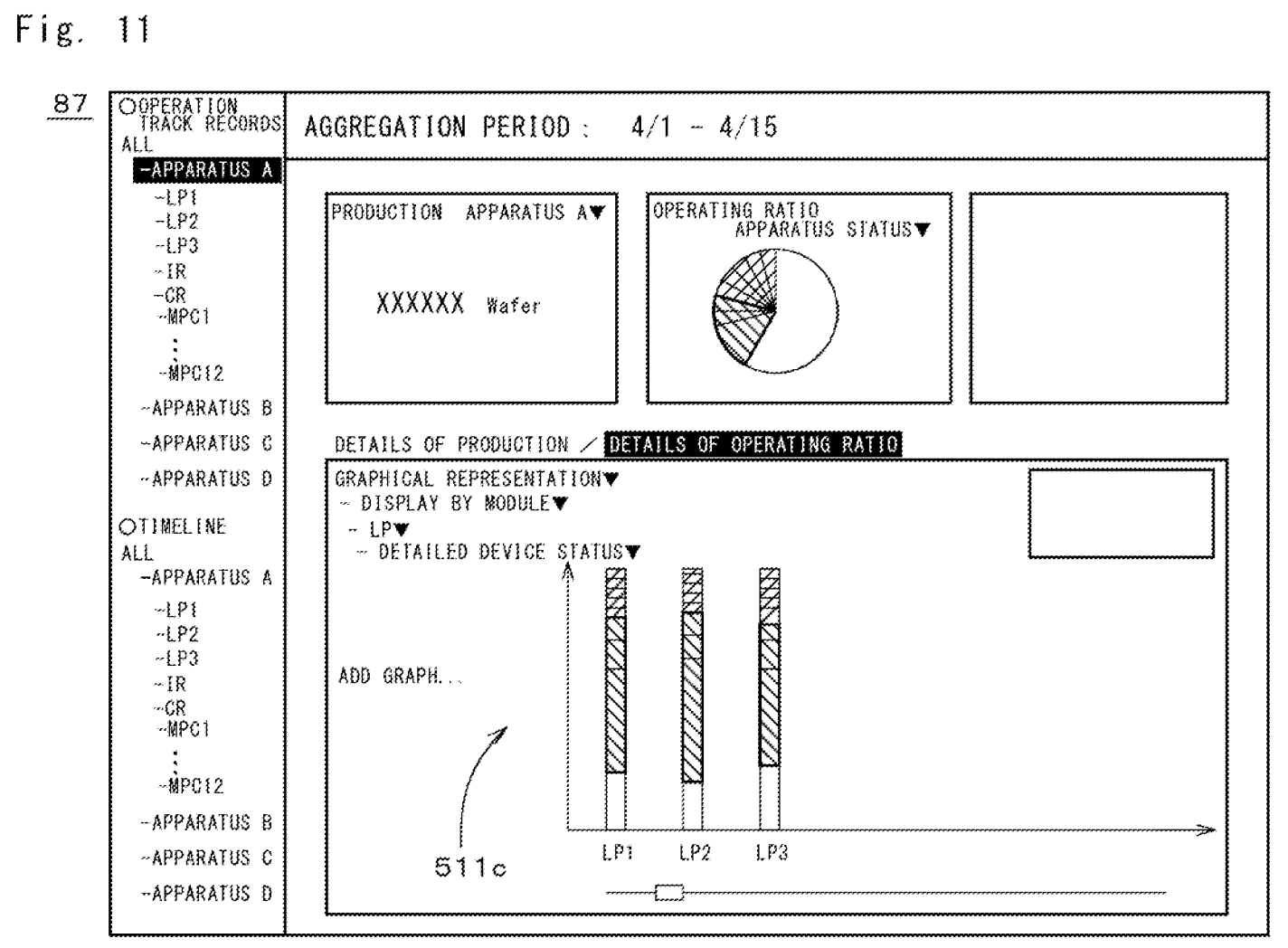

In FIG. 11, a stacked vertical bar graph 511c (hereinafter, also simply referred to as the "graph 511c") that shows a detailed breakdown of the operational status of each load port 11 on one processing date (e.g., April 1), out of the processing dates shown for the operational status in the graph 511b in FIG. 9, is displayed on the display 87. In other words, the display controller 62 arranges the operational status information 72, which is classified into the specifically classified operational statuses regarding the load port group 110, according to the names (i.e., LP1 to LP3) of the load ports 11 as the aforementioned arrangement item and displays the operational status information 72 arranged according to the load ports 11 as the graph 511c on the display 87. This enables the operator to easily compare the operational statuses of the load ports 11 included in the load port group 110. Alternatively, the graph 511c may show the operational status information 72 classified into the broadly classified operational statuses regarding the load port group 110.

Figure 12:
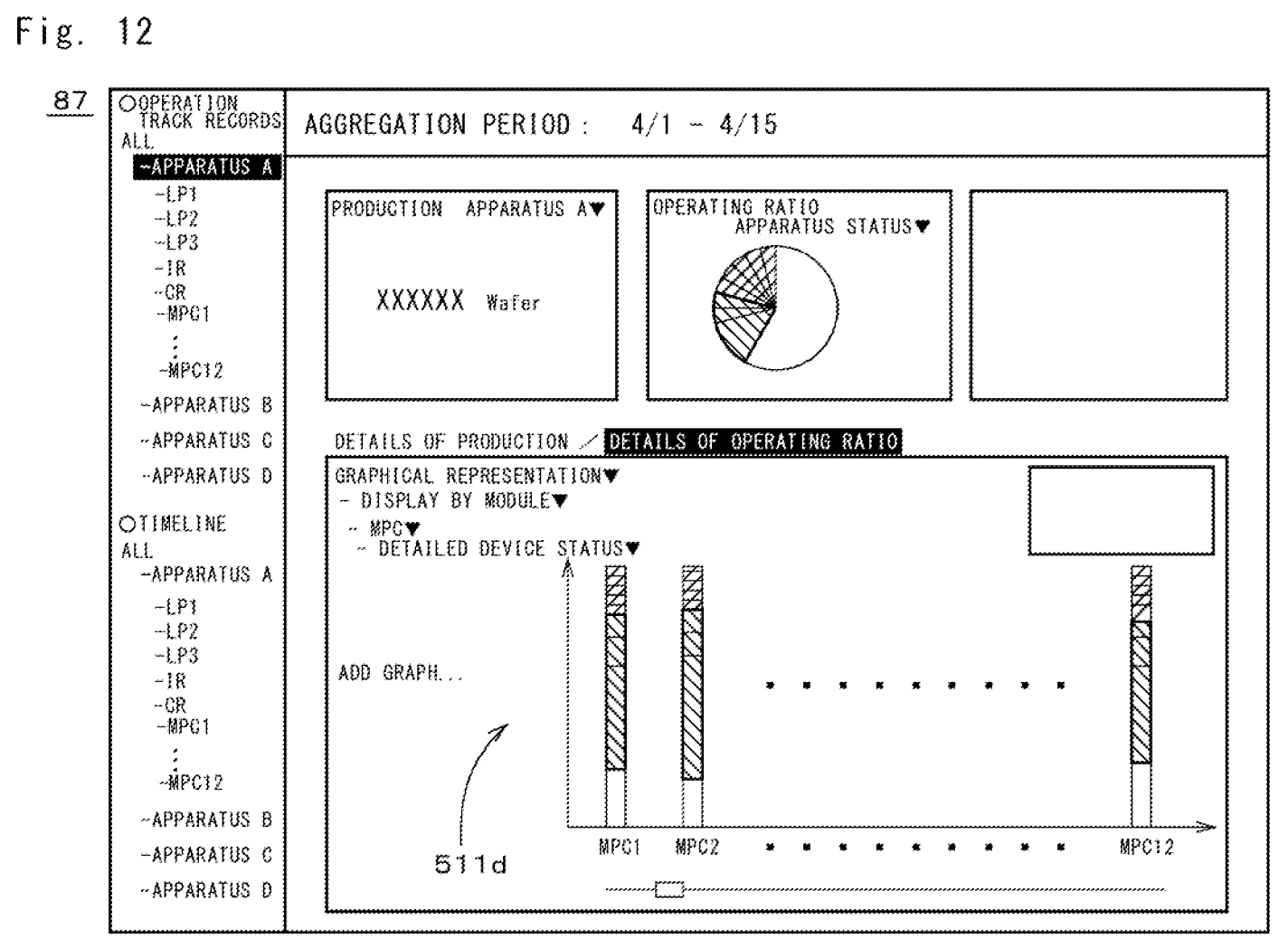

In FIG. 12, a stacked vertical bar graph 511*d* (hereinafter, also simply referred to as the "graph 511*d*") that shows a detailed breakdown of the operational status of each processing unit 21 on one processing date (e.g., April 1), out of the processing dates shown for the operational status in the graph 511*b* in FIG. 9, is displayed on the display 87. In other words, the display controller 62 arranges the operational status information 72, which is classified into the specifically classified operational statuses regarding the processing unit group 210, according to the names (i.e., MPC1 to MPC12) of the processing units 21 as the aforementioned arrangement item and displays the operational status information 72 arranged according to the processing units 21 as the graph 511*d* on the display 87. This enables the operator to easily compare the operational statuses of the processing units 21 included in the processing unit group 210. Alternatively, the graph 511*d* may display the operational status information 72 classified into the broadly classified operational statuses regarding the processing unit group 210.

The aforementioned operational status information 72 includes, in addition to the temporal breakdown of the operational status of each operating part, time stamps that are associated with the operational statuses of the operating parts and that indicate starting points and endpoints of the operational statuses. For example, when the operational status of one load port 11 transitions from the specifically classified operational status of "Ready" to the specifically classified operational status of "Execute," the endpoint (i.e., the stop time) of "Ready" and the starting point (i.e., start time) of "Execute" are included as time stamps in the operational status information 72. When the operational status of one load port 11 transitions from the specifically classified operational status of "Execute" to the specifically classified operational status of "Prepare," the endpoint (i.e., stop time) of "Execute" and the starting point (i.e., start time) of "Prepare" are included as time stamps in the operational status information 72.

Specifically, when a command signal or the like that corresponds to "Execute" is transmitted from the aforementioned operation controller to one load port 11 in the "Ready" status, a time of the day when this command signal or the like has been transmitted is acquired as the endpoint of "Ready" and the starting point of "Execute" from the information storage 61 and is included as time stamps in the operational status information 72. When a command signal or the like that corresponds to "Prepare" is transmitted from the aforementioned operation controller to one load port 11 in the "Execute" status, a time of the day when this command signal or the like has been transmitted is acquired as the endpoint of "Execute" and the starting point of "Prepare" from the information storage 61 and is included as time stamps in the operational status information 72.

The display controller 62 is capable of providing a time-line display (so-called a timeline) that indicates the operational statuses of the operating parts in time sequence on the basis of the aforementioned time stamps. FIG. 13 is an diagram showing a time-line display 517 of the operational status of one load port 11. Each rectangle in the time-line display 517 corresponds to one specifically classified operational status of the operational status of the load port 11. In FIG. 13, each specifically classified operational status is not cross hatched. A window 518 displays the time stamps of each specifically classified operational status of the load port 11. This enables the operator to easily recognize a change in the operational status of the operating part with time on the basis of the time-line display 517 and the time stamps. In the substrate processing apparatus 1, a time-line display 517 that indicates the operational status of an operating part other than the load ports 11 (e.g., a processing unit 21) may be displayed on the display 87. As another alternative, the time-line display 517 that indicates the operational statuses of a plurality of operating parts may be arranged according to the operating parts and provided simultaneously on the display 87.

Figure 14:
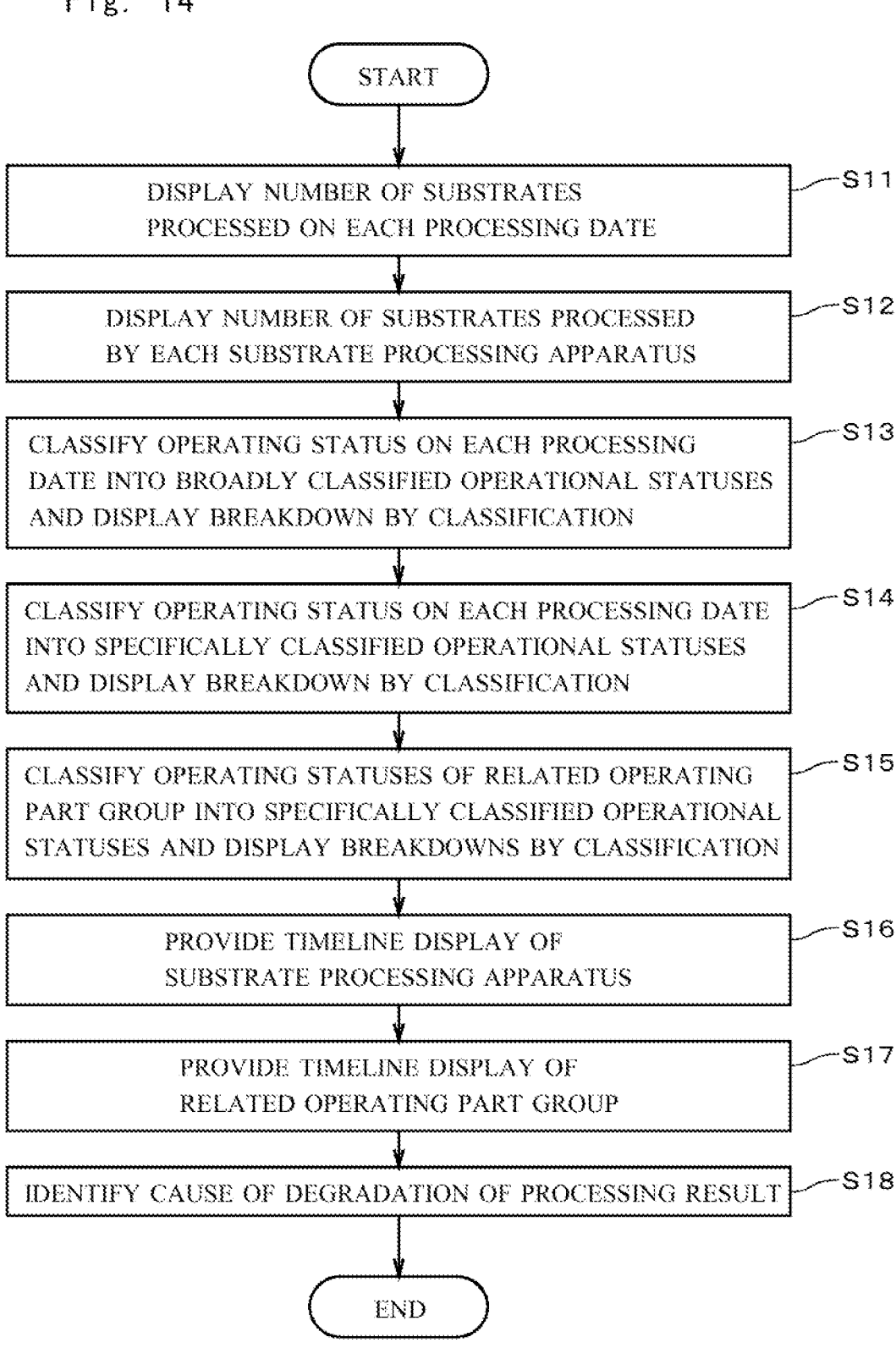
FIG. 14 is a flowchart of operational status analysis.

Next is a description of the analysis of the operational status of the substrate processing apparatus 1, using the above-described result information 71 and the above-described operational status information 72 displayed on the display 87. FIG. 14 is a diagram showing one example of the procedure of operational status analysis.

Figure 15:
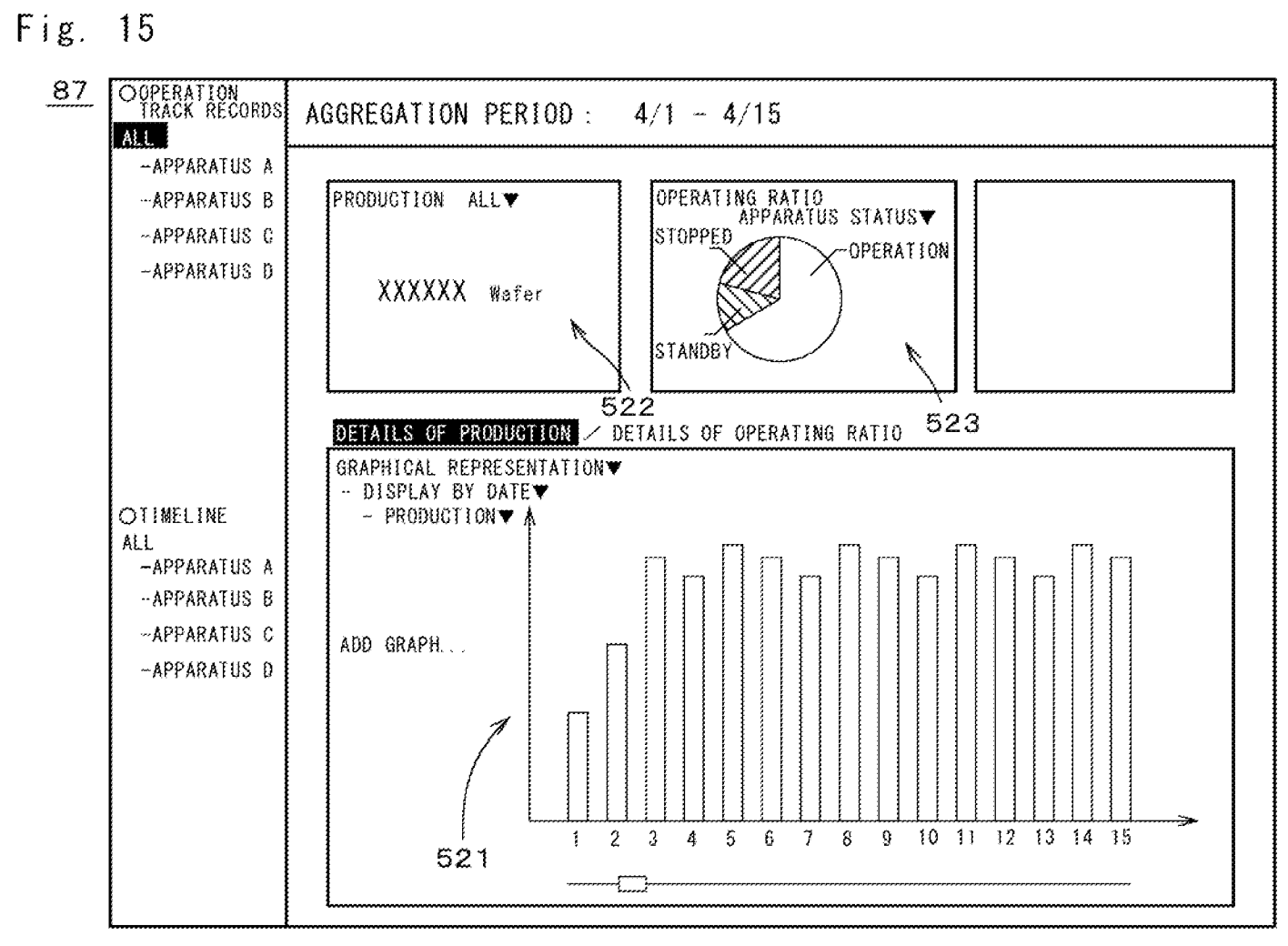

First, the operator displays the processing result information 71 and the operational status information 72 regarding all of the aforementioned four substrate processing apparatuses 1 (i.e., apparatuses A to D) on the display 87 as illustrated in FIG. 15. A bar graph 521 shows a total of the numbers of substrates 9 processed by the four substrate processing apparatuses 1 on each processing date during the aforementioned specified period of aggregation (April 1 to 15). In other words, the processing result information 71 arranged according to the processing dates of substrates 9 is displayed in the graph 521 (step S11). A graph 523 shows a breakdown of the sum of the operational statuses of the four substrate processing apparatuses 1. A window 522 displays a total number of substrates 9 processed (i.e., total production) during the specified period of aggregation.

Figure 16:
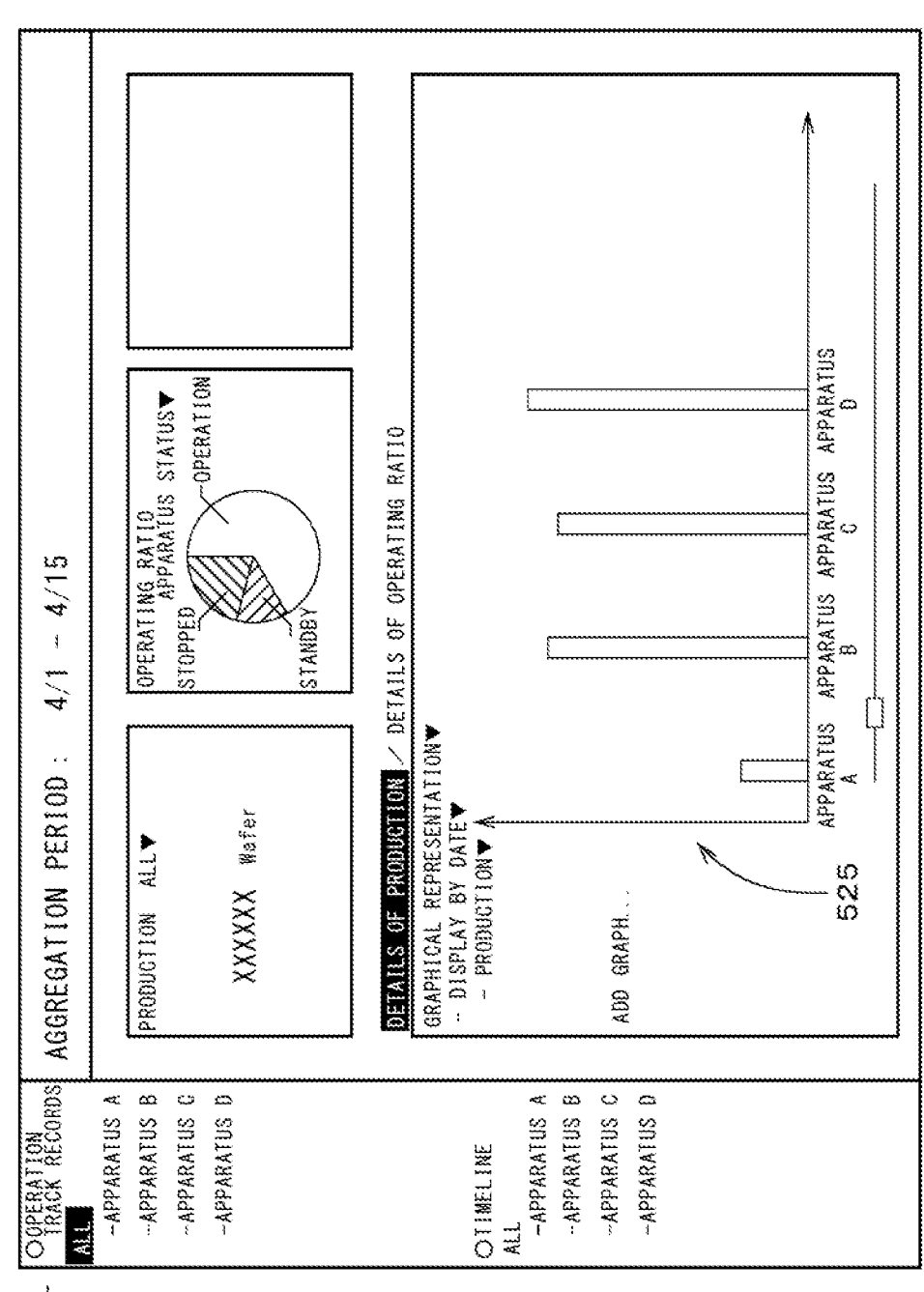
FIG. 16 is a diagram showing a screen on the display.

Upon confirming that the total number of substrates 9 processed during the specified period of aggregation is smaller than normal and that there is any processing date that has produced a smaller number of substrates processed (e.g., April 1 and 2) than the other processing dates, the operator displays a bar graph 525 that shows the number of substrates 9 processed by each substrate processing apparatus 1 during the specified period of aggregation on the display 87, as illustrated in FIG. 16 (step S12). Specifically, the display controller 62 displays the graph 525 based on the processing result information 71 on the display 87 in accordance with an operation by the operator. This enables the operator to confirm which of the substrate processing apparatuses 1 is the cause of the reduced number of substrates processed.

Figure 17:
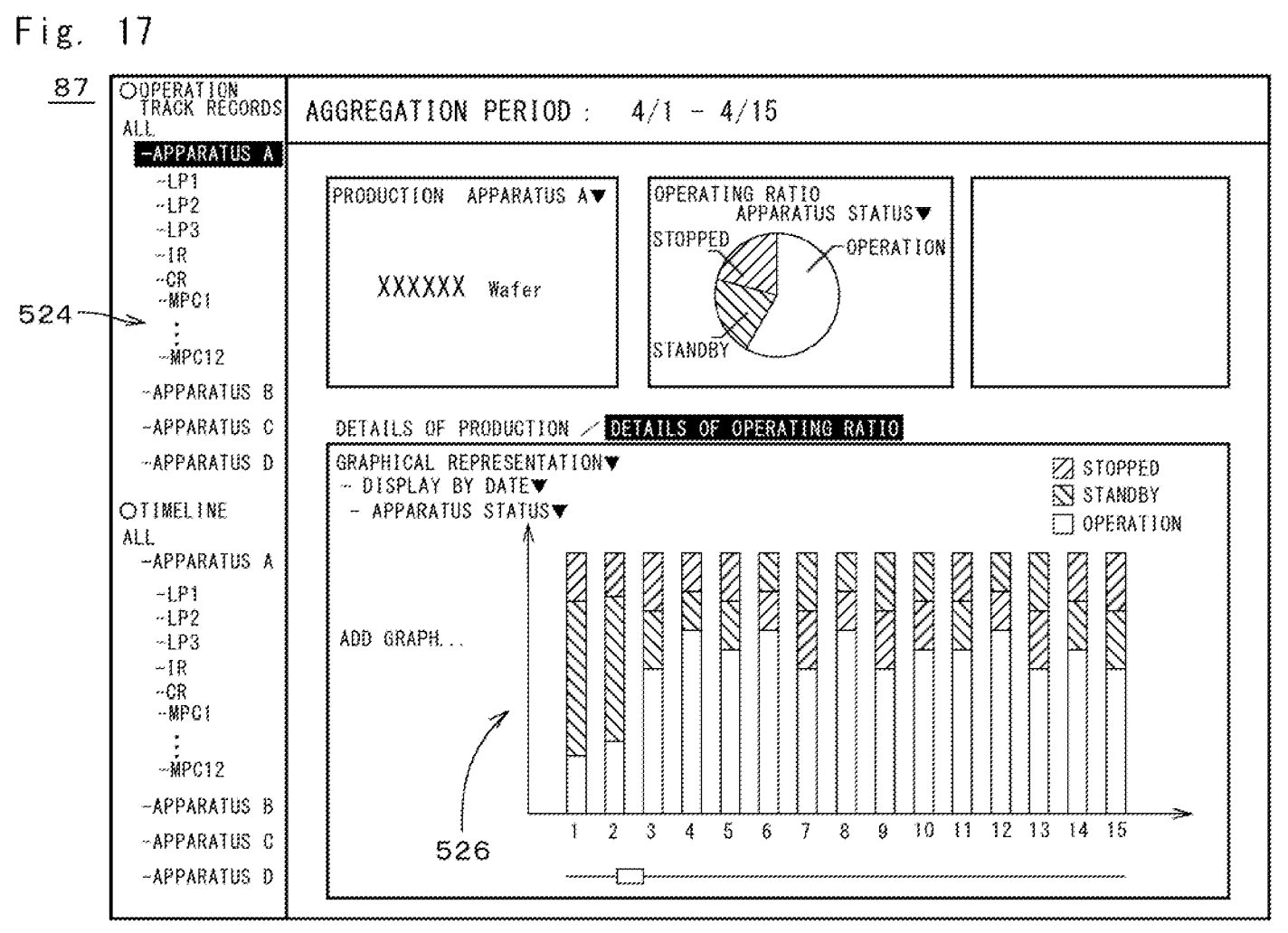

Upon confirming that the number of substrates processed by the substrate processing apparatus 1 named as "Apparatus A" during the specified period of aggregation is smaller than the numbers of substrates processed by the other substrate processing apparatuses 1, the operator displays, on the display 87, a stacked vertical bar graph 526 (hereinafter, also simply referred to as the "graph 526") that shows the breakdown of the operational status of Apparatus A on each processing date during the specified period of aggregation while classifying the operational status into the broadly classified operational statuses, as illustrated in FIG. 17 (step S13). In other words, the operational status information 72 regarding Apparatus A is classified into the broadly classified operational statuses and displayed while being arranged according to the dates of processing of substrates 9. Specifically, when the operator operates a switching window 524, the display controller 62 displays the graph 526 based on the operational status information 72 on the display 87. This enables the operator to easily recognize one or more broadly classified operational statuses that are presumed to be the causes of the reduced number of substrates processed by the substrate processing apparatus 1 (i.e., the cause of deterioration of the processing result). Hereinafter, unless otherwise specified, information that the operator displays on the display 87 is the information regarding Apparatus A.

Between steps S12 and S13, a bar graph showing the number of substrates processed by Apparatus A on each processing date may be displayed on the display 87. This enables the operator to clearly recognize that, on a processing date that has produced a smaller number of substrates (e.g., April 1 and 2), Apparatus A is the cause of the reduced number of substrates processed.

Figure 18:
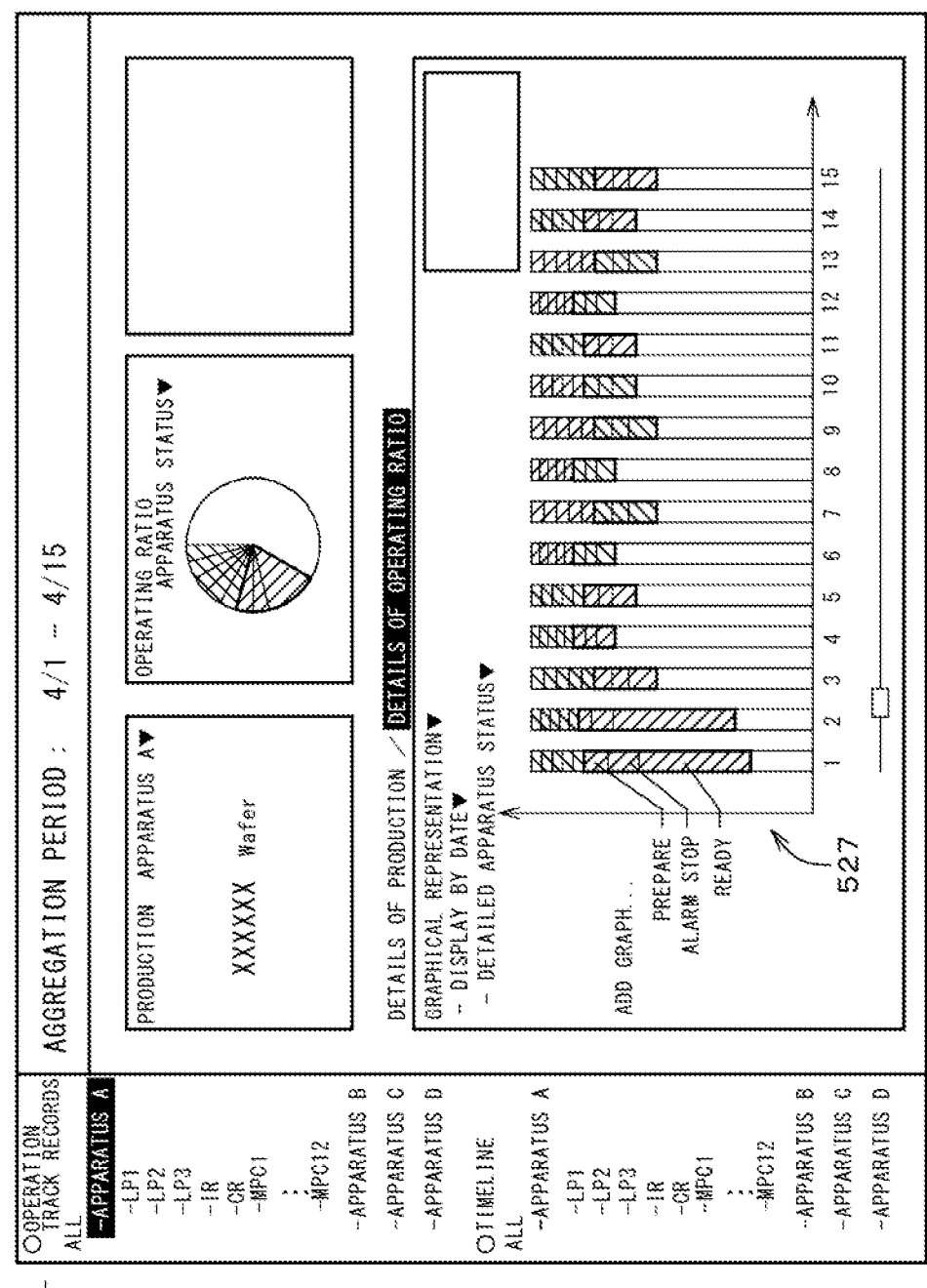
FIG. 18 is a diagram showing a screen on the display.

Upon recognizing in step S13 that the "Standby" status out of the broadly classified operational statuses is the cause of the reduced number of substrates processed, the operator classifies the "Standby" status into a plurality of specifically classified operational statuses and displays the specifically classified operational statuses on the display 87. In the present embodiment, the display 87 displays a stacked vertical bar graph 527 (hereinafter, also simply referred to as the "graph 527") that shows the breakdown of the operational status of Apparatus A on each processing date during the specified period of aggregation and in which each of the broadly classified operational statuses is classified into a plurality of specifically classified operational statuses is displayed on the display 87 as illustrated in FIG. 18 (step S14). This enables the operator to easily recognize one or more specifically classified operational statuses that are presumed to be the cause of the reduced number of substrates processed (i.e., the cause of the deterioration of the processing result) out of the specifically classified operational statuses included in the "Standby" status.

Figure 19:
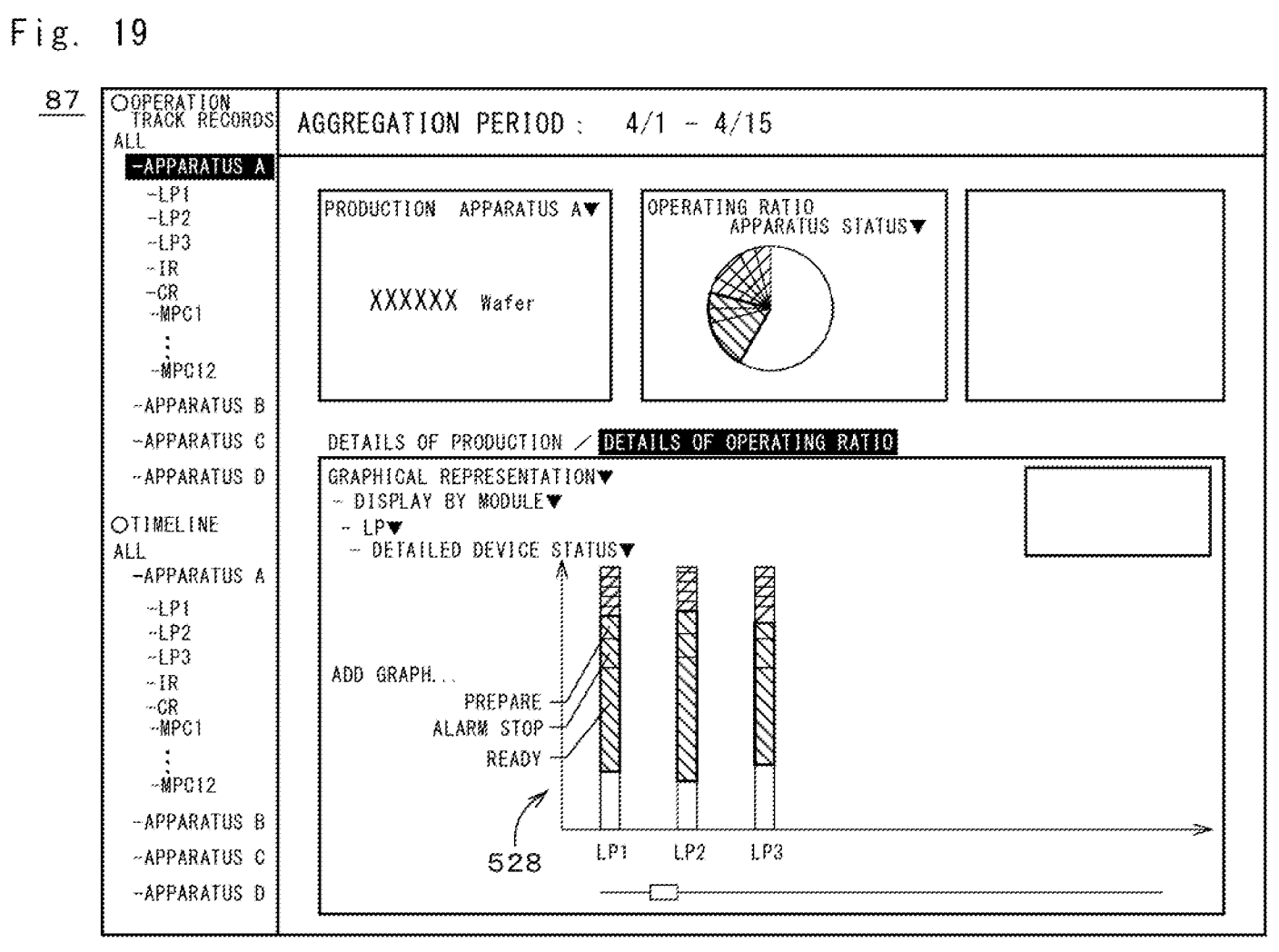

Upon recognizing that the "Ready" status out of the specifically classified operational statuses included in the "Standby" status is the cause of the reduced number of substrates processed, the operator selects a group of operating parts relating to the "Ready" status, namely a related operating part group, from among the operating part group of the substrate processing apparatus 1. In this case, the operator selects a plurality of load ports 11 as the related operating part group because the substrate processing apparatus 1 is not processing substrates 9 (i.e., in the "Ready" status), irrespective of being in a state capable of processing substrates 9, and therefore it is assumed that there is a long period of time during which substrates 9 to be processed are not transported into the substrate processing apparatus 1 (i.e., a long time for waiting for the transport in of carriers 95). Then, for a processing date that has produced a smaller number of substrates processed (e.g., April 1) than the other processing dates, a stacked vertical bar graph 528 (hereinafter, also simply referred to as the "graph 528") that shows the breakdowns of the operational statuses of the load ports 11 and in which each operational status is classified into a plurality of specifically classified operational statuses is displayed on the display 87 as illustrated in FIG. 19 (step S15). The operator can see from the graph 528 that the load ports 11 are waiting for the transport in of carriers 95 because each load port 11 stays long in the "Ready" status.

Figure 20:
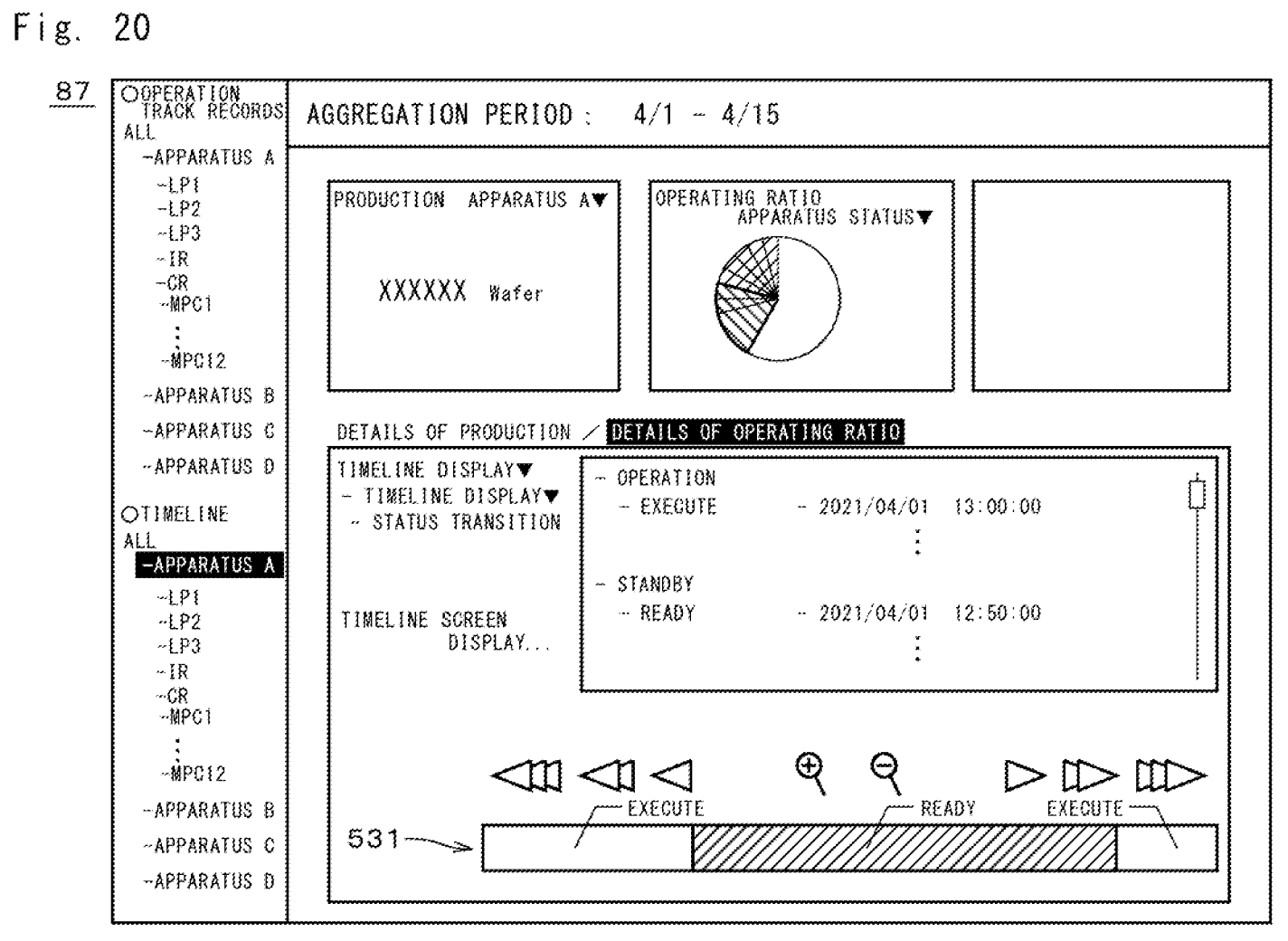

In order to confirm the detailed operational status of the substrate processing apparatus 1, the operator provides a time-line display 531 on the display 87 as illustrated in FIG. 20, the time-line display 531 showing the operational status of the substrate processing apparatus 1 (i.e., Apparatus A) in time sequence (step S16). In FIG. 20, a time zone when the substrate processing apparatus 1 stays long in the "Ready" status, out of the time-line display 531, is displayed in enlarged dimensions.

Figure 21:
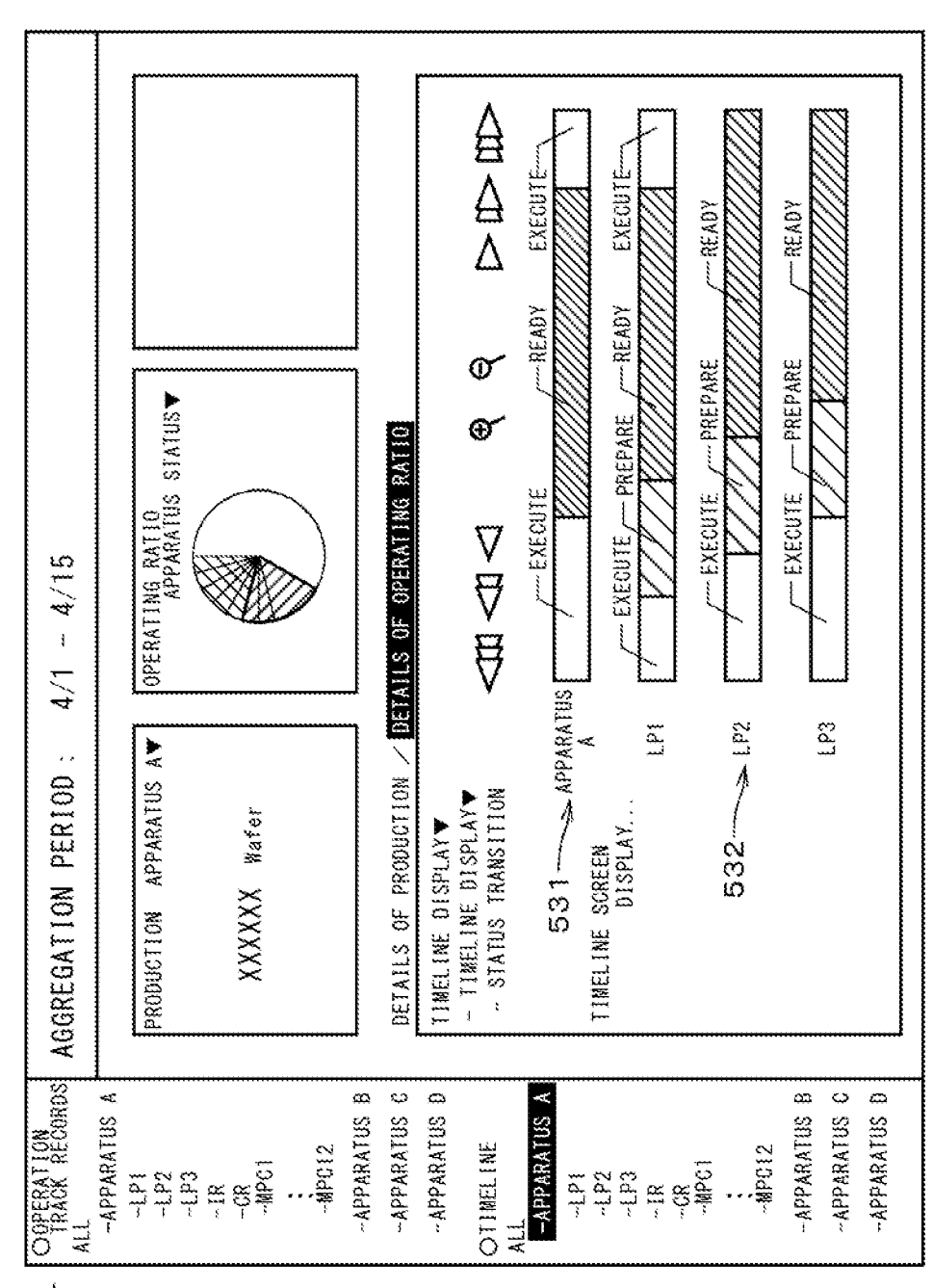
FIG. 21 is a diagram showing a screen on the display.

Then, the operator provides a time-line display 532 on the display 87 as illustrated in FIG. 21, the time-line display 532 showing the operational statuses of the aforementioned related operating part group (i.e., the load port group 110) in time sequence (step S17). In FIG. 21, the time-line display 532 that indicates the operational status of each load port 11 in time sequence is arranged according to the load ports 11 and provided together with the time-line display 531 of the substrate processing apparatus 1 on the display 87. This enables the operator to easily compare the time series of the substrate processing apparatus 1 and the time series of the aforementioned related operating part group.

The operator compares the time-line display 531 and the time-line display 532 and confirms that the timing of the "Ready" status of the substrate processing apparatus 1 appropriately matches the timing of the "Ready" status of the load port group 110. In this way, the operator is able to identify that the cause of the reduced number of substrates processed by the substrate processing apparatus 1 (Apparatus A) on April 1 (i.e., the cause of the deterioration of the processing result) is the prolonged "Ready" status due to an insufficient number of carriers 95 transported into the substrate processing apparatus 1 (step S18).

As described above, the substrate processing apparatus 1 includes the load port group 110, the processing unit group 210, the transport mechanism (in the above-described example, the indexer robot 12 and the center robot 22), the information storage 61, the information display (i.e., the display 87), and the display controller 62. The load port group 110 is a group of load ports 11 each holding a carrier 95 in which a plurality of substrates 9 are stored. The processing unit group 210 is a group of processing units 21 in which substrates 9 are processed. The transport mechanism transports substrates 9 between the load port group 110 and the processing unit group 210. The information storage 61 stores the operation information 70 regarding operations of the operating part group of operating parts that include the load port group 110, the processing unit group 210, and the transport mechanism. The display controller 62 displays the operation information 70 in a predetermined mode of display on the display 87.

The operation information 70 includes the processing result information 71 that indicates the result of the processing of substrates 9 performed by the substrate processing apparatus 1, and the operational status information 72 that indicates a temporal breakdown of the operational status of the substrate processing apparatus 1 and temporal breakdowns of the operational statuses of the operating parts included in the operating part group. The operational status of each of the substrate processing apparatus 1 and the operating parts is hierarchically classified into a plurality of broadly classified operational statuses according to a large classification and into a plurality of specifically classified operational statuses obtained by further classifying the broadly classified operational statuses. The display controller 62 displays the processing result information 71 on the display 87 while arranging the processing result information 71 according to an arrangement item selected from among a predetermined arrangement item group that includes an arbitrary operating period of the substrate processing apparatus 1. The display controller 62 classifies the operational status information 72 into a plurality of broadly classified operational statuses and into a plurality of specifically classified operational statuses and displays the classified operational status information 72 on the display 87 while arranging the operational status information 72 according to an arrangement item selected from among the aforementioned arranged item group. This enables the operator who views the display 87 to easily recognize detailed operational statuses of the operating parts in association with the result of processing substrates 9.

As described above, it is preferable that, when classifying the operational status information 72 into a plurality of broadly classified operational statuses and displaying the classified operational status information 72 on the display 87 while arranging the operational status information 72 according to the aforementioned arrangement item, the display controller 62 displays the operational status information in the first graph (i.e., the stacked vertical bar graph 511*a* in FIG. 8) in which the broadly classified operational statuses are divided by color. It is also preferable that, when classifying the operational status information 72 into a plurality of specifically classified operational statuses and displaying the classified operational status information 72 on the display 87 while arranging the operational status information 72 according to the aforementioned arrangement item, the display controller 62 displays the operational status information 72 in the second graph (e.g., the stacked vertical bar graph 511*b* in FIG. 9) in which the specifically classified operational statuses are divided by color. In the second graph, it is preferable that a plurality of specifically classified operational statuses that belong to one broadly classified operational status are displayed in colors akin to the color of the one broadly classified operational status in the first graph. This enables the operator to easily recognize rough breakdowns of the operational statuses of the operating parts and detailed breakdowns thereof in association with each other.

As described above, it is preferable that the operational status information 72 includes time stamps that are associated with the operational statuses of the operating parts and that indicate starting points and endpoints of the operational statuses. It is also preferable that the display controller 62 displays a timeline display (e.g., the timeline display 517 in FIG. 13) that indicates the operational statuses in time sequence on the display 87. This enables the operator to easily recognize a change in the operational statuses of the operating parts with time.

As described above, it is preferable that the display controller 62 displays the operational status information 72 regarding the load port group 110 on the display 87 while arranging the operational status information 72 according to the load ports 11 (e.g., as in the graph 511*c* in FIG. 11). This enables the operator to easily compare the operational statuses of the load ports 11 included in the load port group 110.

As described above, it is preferable that the display controller 62 displays the operational status information 72 regarding the processing unit group 210 on the display 87 while arranging the operational status information 72 according to the processing units 21 (e.g., as in the graph 511*d* in FIG. 12). This enables the operator to easily compare the operational statuses of the processing units 21 included in the processing unit group 210.

As described above, it is preferable that the display controller 62 also displays, on the aforementioned display 87, the processing result information 71 and the operational status information 72 both regarding other substrate processing apparatuses that are identical in configuration to the substrate processing apparatus 1. This enables the operator to easily compare the results of processing performed by a plurality of substrate processing apparatuses 1 and compare the operational statuses of a plurality of substrate processing apparatuses 1. The operator is also able to easily collect the results of processing performed by a plurality of substrate processing apparatuses 1.

As described above, the analysis method of analyzing the operational status of the substrate processing apparatus 1 includes the step of displaying the processing result information 71 on the information display (i.e., display 87) of the substrate processing apparatus 1 while arranging the processing result information 71 according to an arbitrary operating period of the substrate processing apparatus 1 (step S11), the step of classifying the operational status information 72 into a plurality of broadly classified operational statuses and displaying the classified operational status information 72 on the display 87 while arranging the operational status information 72 according to the aforementioned operating period of the substrate processing apparatus 1 (step S13), the step of classifying one of the broadly classified operational statuses that is presumed to be the cause of deterioration of the processing result into a plurality of specifically classified operational statuses and displaying the specifically classified operational statuses on the display 87 (step S14), and the step of focusing on one of the specifically classified operational statuses that is presumed to be the cause of deterioration in the processing result, selecting a group of operating parts relating to the one specifically classified operational status, namely the related operating part group (in the above-described example, the load port group 110), from among the operating part group, and providing, on the display 87, a timeline display that indicates the operational status of the substrate processing apparatus 1 in time sequence (in the above-described example, the timeline display 531) and a timeline display that indicates the operating status of each operating part included in the related operating part group in time sequence (in the above-described example, the timeline display 532 (steps S16 and S17). This enables the operator to easily identify the cause of deterioration of the result of processing performed by the substrate processing apparatus 1.

In the example described above, the program 89 relating to the display of the operation information 70 is stored in advance in the computer 8 of the substrate processing apparatus 1, but the present invention is not limited to this example. For example, the program 89 may be introduced later (i.e., retrofitted) into the already used substrate processing apparatus 1. In this case, when the computer executes the program 89 for causing the operation information 70 to be displayed in a predetermined mode of display on the display 87, the processing result information 71 is displayed on the display 87 while being arranged according to an arrangement item selected from among a predetermined arrangement item group that includes an arbitrary operating period of the substrate processing apparatus 1. Moreover, the operational status information 72 is classified into a plurality of broadly classified operational statuses and into a plurality of specifically classified operational statuses and displayed on the display 87 while being arranged according to an arrangement item selected from among the arrangement item group. This enables the operator who views the display 87 to easily recognize detailed operational statuses of the operating parts in association with the results of processing substrates 9 in the same manner as described above.

In the above-described example, the substrate processing apparatus 1 includes the configuration relating to the display of the operation information 70, but this configuration may be provided as another display device different from the substrate processing apparatus 1. In this case, the display device includes the information display (i.e., the display 87) and the display controller 62. The display controller 62 displays the operation information 70 in a predetermined mode of display on the display 87. The display controller 62 displays the processing result information 71 on the display 87 while arranging the processing result information 71 according to an arrangement item selected from among a predetermined arrangement item group that includes an arbitrary operating period of the substrate processing apparatus 1. The display controller 62 also classifies the operational status information 72 into a plurality of broadly classified operational statuses and into a plurality of specifically classified operational statuses and displays the classified operational status information 72 on the display 87 while arranging the operational status information 72 according to an arrangement item selected from the aforementioned arrangement item group. This enables the operator who views the display 87 to easily recognize the detailed operational statuses of the operating parts in association with the result of processing of the substrates 9 in the same manner as described above. Note that the display device may display the operation information 70 regarding one substrate processing apparatus 1, or may display the operation information 70 regarding a plurality of substrate processing apparatuses 1.

Figure 22:
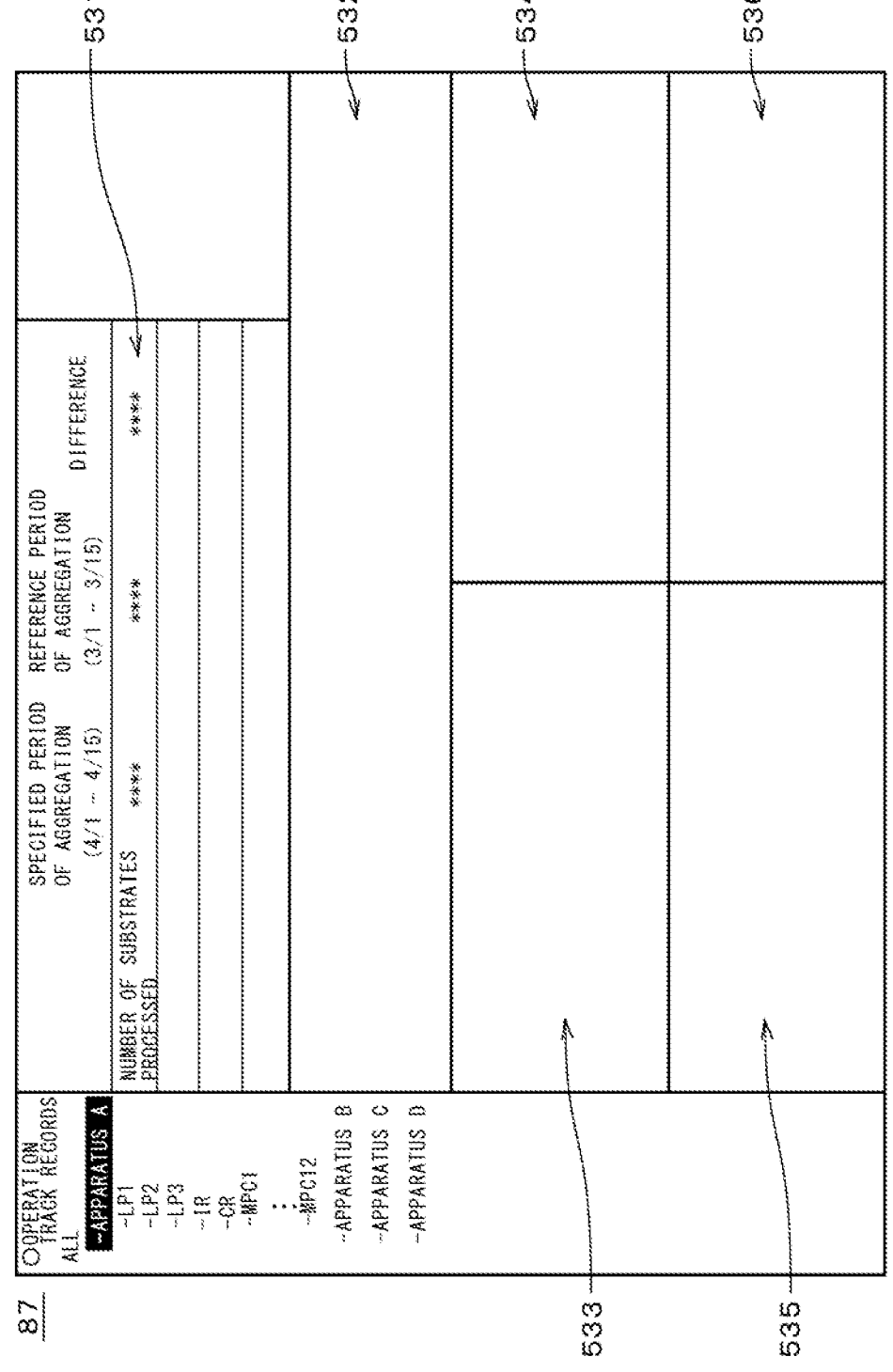
FIG. 22 is a diagram showing a screen on the display.

FIG. 22 is a diagram showing an exemplary screen on the display 87, different from the examples illustrated in FIG. 7 and other figures. In the example illustrated in FIG. 22, the processing result information 71 (see FIG. 6) regarding the substrate processing apparatus 1 during a predetermined specified period of aggregation (April 1 to 15) is displayed on the display 87. Specifically, the display controller 62 (see FIG. 5) displays, on the display 87, the number of substrates 9 processed by the substrate processing apparatus 1 during the specified period of aggregation, while arranging this number from various points of view.

In FIG. 22, a window 531 provides a display in a table format that makes it possible to compare the processing result information 71 during the specified period of aggregation and processing result information during a predetermined reference period of aggregation (hereinafter, also referred to as the "reference processing result information"). In the example illustrated in FIG. 22, the number of substrates 9 processed by the substrate processing apparatus 1 during the specified period of aggregation, the number of substrates 9 processed during the reference period of aggregation, and a difference in the number of substrates 9 processed between the specified period of aggregation and the reference period of aggregation are displayed in numeric values (in FIG. 22, the numeric values are indicated by "****") in the window 531. The reference processing result information is prepared and stored in advance in the information storage 61 (see FIG. 5). The reference period of aggregation is displayed in the upper part of the window 531. In the example illustrated in FIG. 22, the reference period of aggregation is from March 1 to March 15. Note that the specified period of aggregation and the reference period of aggregation can be appropriately changed. The length of the reference period of aggregation may be the same as or different from the length of the specified period of aggregation. Alternatively, the window 531 may also display information other than the number of substrates 9 processed (e.g., the number of substrates 9 processed per unit time), instead of or in addition to the number of substrates 9 processed.

Figure 23:
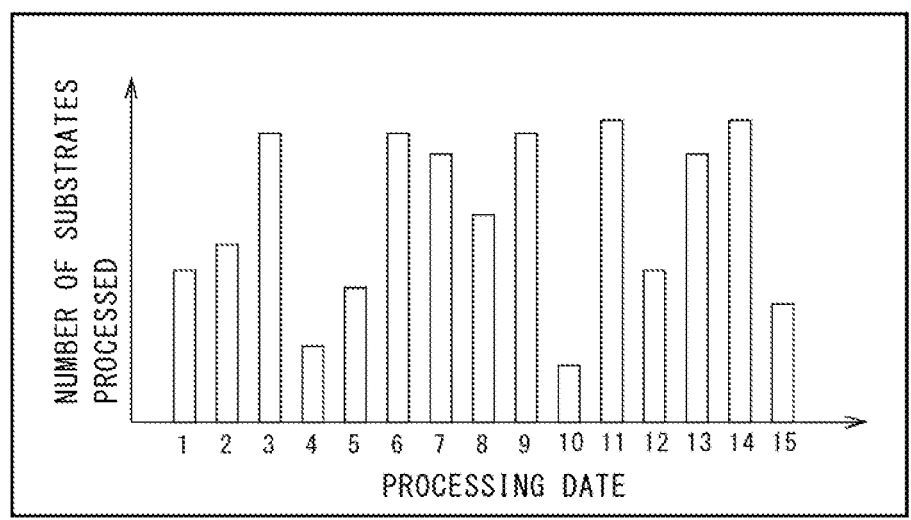
FIG. 23 is a diagram showing part of a screen on the display in enlarged dimensions.

The display controller 62 displays the processing result information 71 in the windows 532 to 536 while arranging the processing result information 71 according to a plurality of arrangement items included in the aforementioned arrangement item group. FIGS. 23 to 27 are diagrams respectively showing the windows 532 to 536 in enlarged dimensions. As illustrated in FIG. 23, the window 532 displays a bar graph in which the number of substrates 9 processed by the substrate processing apparatus 1 during the specified period of aggregation is arranged according to processing dates, which serve as one arrangement item, as in the graph 511 in FIG. 7. In the window 531, the horizontal axis of the graph indicates the processing date, and the vertical axis indicates the number of substrates 9 processed.

Figure 24:
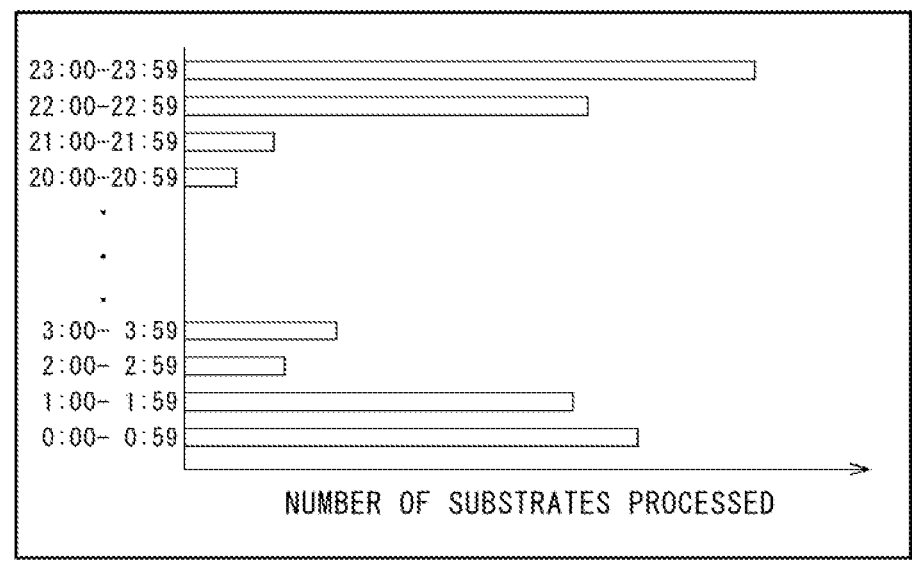
FIG. 24 is a diagram showing part of a screen on the display in enlarged dimensions.

As illustrated in FIG. 24, the window 533 displays a bar graph in which the number of substrates 9 processed by the substrate processing apparatus 1 during the specified period of aggregation is arranged according to operation time zones, which serve as one arrangement item. In the window 533, the vertical axis of the graph indicates the operation time zone, and the horizontal axis indicates the number of substrates 9 processed. In this graph, one day (24 hours) is divided into 24 equal time zones, and a total number of substrates 9 processed during each time zone of the specified period of aggregation is shown. Note that the number of time zones that divide one day (i.e., how many operation time zones one day is divided into) may be appropriately changed. In the case of dividing one day into a plurality of operation time zones, one day does not necessarily have to be divided into equal time zones. For example, an important time zone may be divided into short time zones, and a not-so-important time zone may be divided into long time zones.

Figure 25:
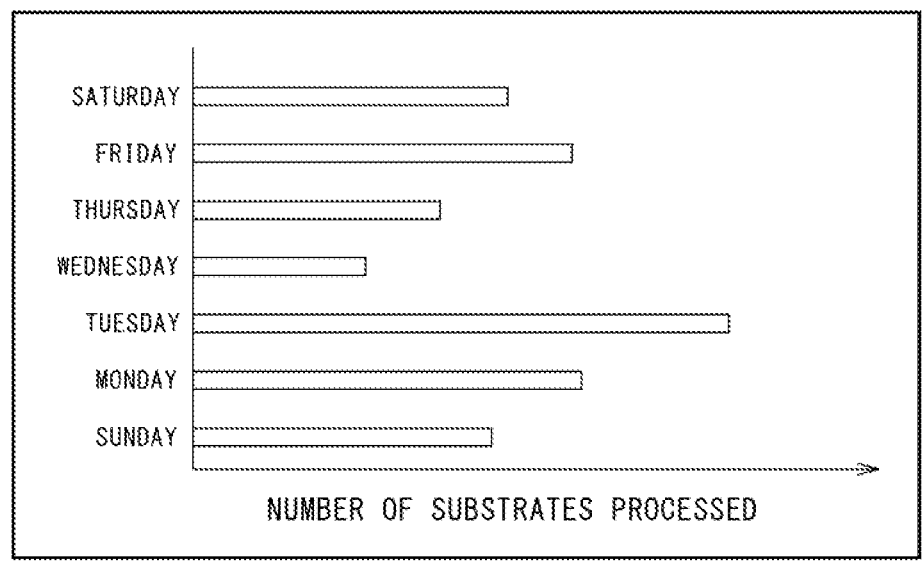
FIG. 25 is a diagram showing part of a screen on the display in enlarged dimensions.

As illustrated in FIG. 25, the window 534 displays a bar graph in which the number of substrates 9 processed by the substrate processing apparatus 1 during the specified period of aggregation is arranged according to the operating days of the week, which serve as one arrangement item. In the window 534, the vertical axis of the graph displayed indicates the operating day of the week, and the horizontal axis indicates the number of substrates 9 processed. This graph shows a total number of substrates 9 processed on each day of the week during the specified period of aggregation. In this graph, the numbers of substrates 9 processed on a plurality of days of the week (e.g., two days of the week on which the substrate processing apparatus 1 has been used for a short time) may be collectively shown as one graph element.

Figure 26:
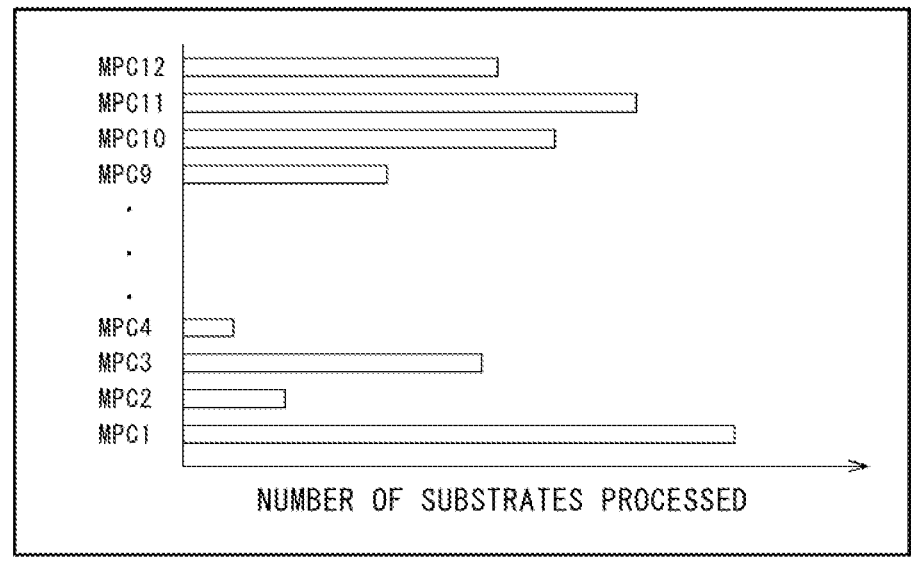
FIG. 26 is a diagram showing part of a screen on the display in enlarged dimensions.

As illustrated in FIG. 26, the window 535 displays a bar graph in which the number of substrates 9 processed by the substrate processing apparatus 1 during the specified period of aggregation is arranged according to the processing units 21 included in the processing unit group 210. In other words, this graph shows the number of substrates 9 processed by the substrate processing apparatus 1 during the specified period of aggregation while arranging this number of substrates according to the names (i.e., identifiers) of the processing units 21, which serve as one arrangement item. In the window 535, the vertical axis of the graph indicates the name of the processing unit 21, and the horizontal axis indicates the number of substrates 9 processed. This graph shows a total number of substrates 9 processed by each processing unit 21 during the specified period of aggregation.

Figure 27:
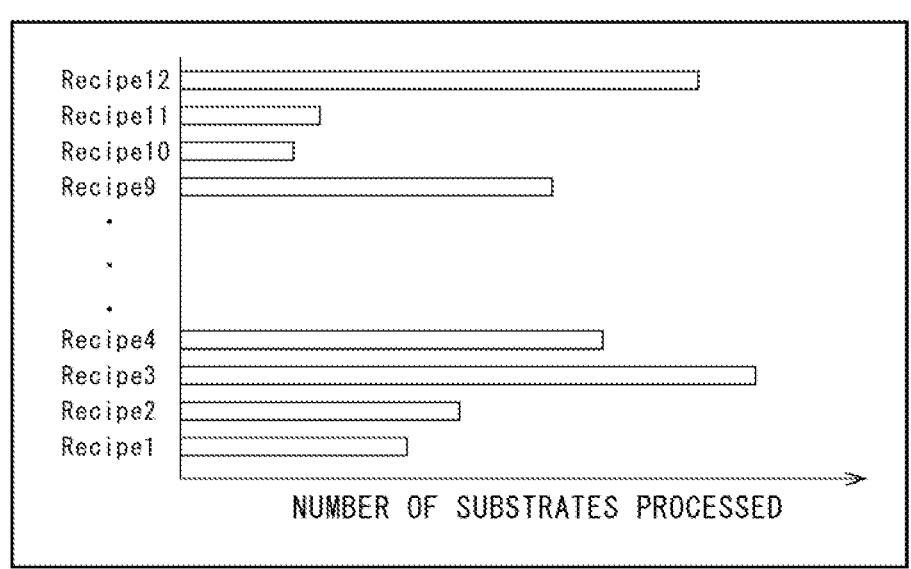
FIG. 27 is a diagram showing part of a screen on the display in enlarged dimensions.

As illustrated in FIG. 27, the window 536 displays a bar graph in which the number of substrates 9 processed by the substrate processing apparatus 1 during the specified period of aggregation is arranged according to processing recipe types, which serve as one arrangement item. In the window 536, the vertical axis of the graph indicates the types of processing recipes, and the horizontal axis indicates the number of substrates 9 processed. This graph shows a total number of substrates 9 processed according to each processing recipe during the specified period of aggregation.

FIG. 28 is a diagram showing another example of a screen on the display 87. In the example illustrated in FIG. 28, the operational status information 72 (see FIG. 6) regarding the substrate processing apparatus 1 during the aforementioned specified period of aggregation (April 1 to 15) is displayed on the display 87. Specifically, the display controller 62 (see FIG. 5) displays, on the display 87, a temporal breakdown of the operational status of the substrate processing apparatus 1 and temporal breakdowns of the operational statuses of the operating parts in the substrate processing apparatus 1 during the specified period of aggregation, while arranging these temporal breakdowns from various points of view.

In FIG. 28, a window 541 provides a display in a table format that makes it possible to compare the operational status information 72 during the specified period of aggregation and the operational status information during the aforementioned reference period of aggregation (hereinafter, also referred to as the "reference operational status information"). In the example illustrated in FIG. 28, the temporal breakdown of the specifically classified operational statuses of the substrate processing apparatus 1 during the specified period of aggregation, the temporal breakdown of the specifically classified operational statuses during the reference period of aggregation, and a difference in the temporal breakdown between the specified period of aggregation and the reference period of aggregation are displayed in numeric values (in FIG. 28, the numeric values are indicated by "**") in the window 541. For example, these numerical values may indicate the proportion (%) of the total time of each specifically classified operational status to the specified period of aggregation or the reference period of aggregation. The reference operational status information is prepared and stored in advance in the information storage 61 (see FIG. 5). The reference period of aggregation is displayed in the upper part of the window 531. In the example illustrated in FIG. 28, the reference period of aggregation is from March 1 to March 15. Note that the specified period of aggregation and the reference period of aggregation may be appropriately changed. The length of the reference period of aggregation may be the same as or different from the length of the specified period of aggregation. Note that a window 547 next to the right side of the window 541** displays a pie chart that indicates the temporal breakdown of the specifically classified operational statuses during the specified period of aggregation.

Figure 29:
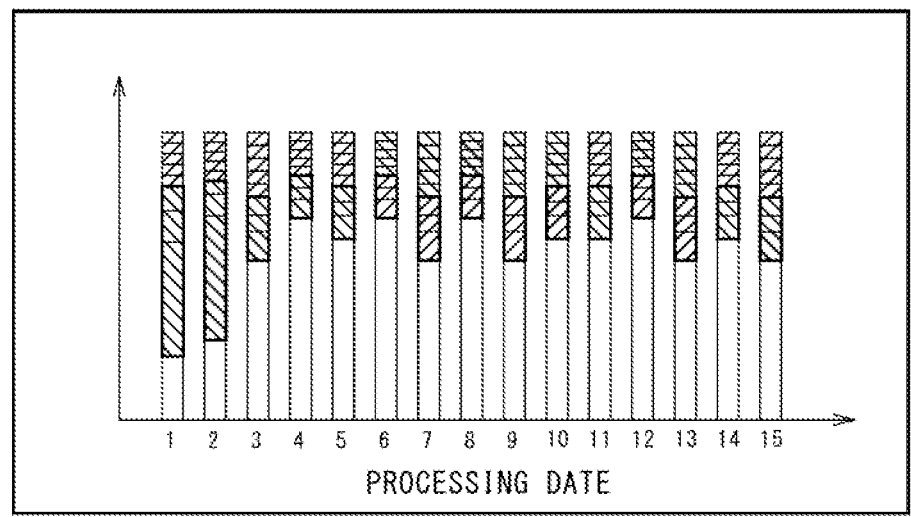
FIG. 29 is a diagram showing part of a screen on the display in enlarged dimensions.

The display controller 62 displays the operational status information 72 in windows 542 to 546 while arranging the operational status information 72 according to the arrangement items included in the aforementioned arrangement item group. FIGS. 29 to 33 are diagrams respectively showing the windows 542 to 546 in enlarge dimensions. As illustrated in FIG. 29, the window 542 displays a stacked vertical bar graph in which the temporal breakdown of the specifically classified operational statuses of the substrate processing apparatus 1 during the specified period of aggregation is arranged according to the processing dates, which serve as one arrangement item, as in the graph 527 in FIG. 18. In the window 542, the horizontal axis of the graph indicates the processing date, and the vertical axis indicates the temporal breakdown of the specifically classified operational statuses (i.e., the proportion of the total time of the specifically classified operational statuses to the usage time of the substrate processing apparatus 1 on each date).

Figure 30:
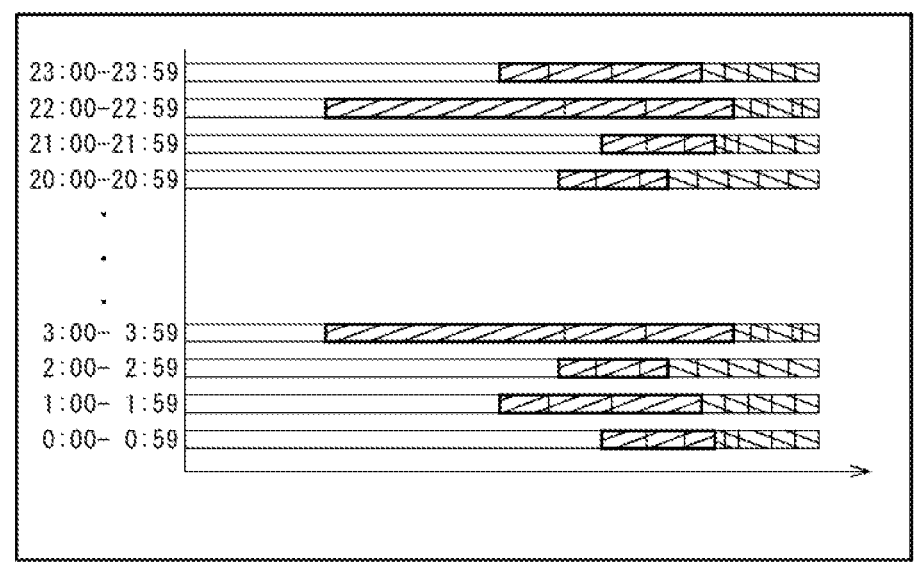
FIG. 30 is a diagram showing part of a screen on the display in enlarged dimensions.

As illustrated in FIG. 30, the window 543 displays a stacked horizontal bar graph in which the temporal breakdown of the specifically classified operational statuses of the substrate processing apparatus 1 during the specified period of aggregation is arranged according to the operation time zones, which serve as one arrangement item. In the window 534, the vertical axis of the graph indicates the operation time zone, and the horizontal axis indicates the temporal breakdown of the specifically classified operational status. In this graph, one day (24 hours) is divided into 24 equal time zones, and the temporal breakdown of the specifically classified operational statuses during each time zone of the specified period of aggregation is shown. Note that the number of time zones that divide one day (i.e., how many operation time zones one day is divided into) may be appropriately changed. In the case of dividing one day into a plurality of operation time zones, one day does not necessarily have to be divided into equal time zones. For example, an important time zone may be divided into short time zones, and a not-so-important time zone may be divided into long time zones.

Figure 31:
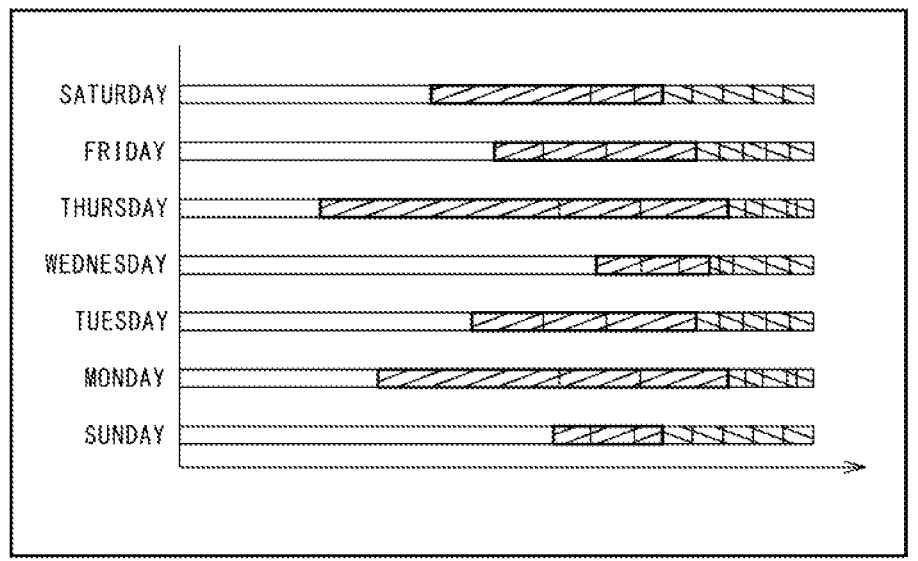
FIG. 31 is a diagram showing part of a screen on the display in enlarged dimensions.

As illustrated in FIG. 31, the window 544 displays a stacked horizontal bar graph in which the temporal breakdown of the specifically classified operational statuses of the substrate processing apparatus 1 during the specified period of aggregation is arranged according to the operating days of the week, which serve as one arrangement item. In the window 544, the vertical axis of the graph indicates the operating day of the week, and the horizontal axis indicates the temporal breakdown of the specifically classified operational statuses. This graph shows the temporal breakdown of the specifically classified operational statuses on each day of the week during the specified period of aggregation. Alternatively, the temporal breakdowns of the specifically classified operational statuses on a plurality of days of the week (e.g., two days of the week on which the substrate processing apparatus 1 is used for a short time) may be collectively shown as one graph element in this graph.

Figure 32:
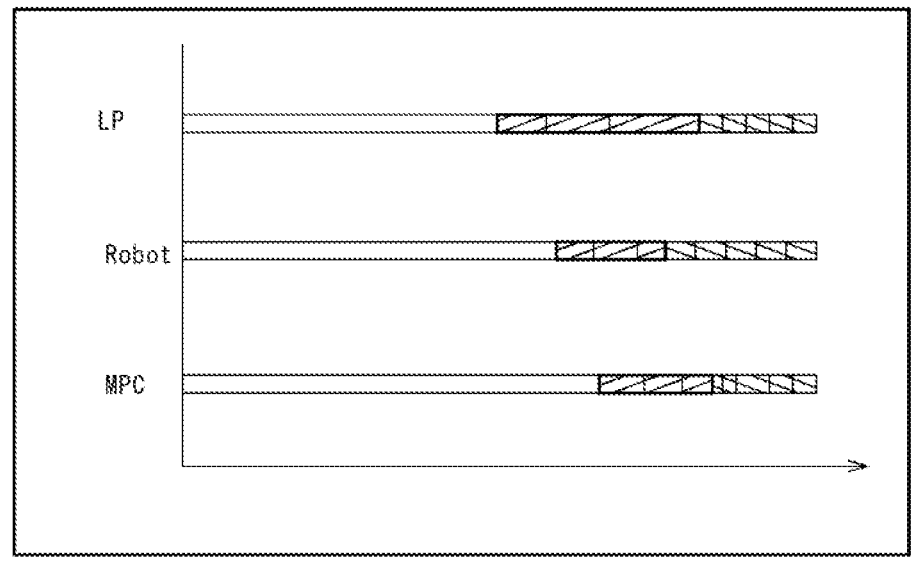
FIG. 32 is a diagram showing part of a screen on the display in enlarged dimensions.

As illustrated in FIG. 32, the window 545 displays a stacked horizontal bar graph that shows the temporal breakdown of the specifically classified operational statuses of each of the load port group 110, the transport mechanism (i.e., the indexer robot 12 and the center robot 22), and the processing unit group 210, described above, during the specified period of aggregation. In other words, this graph shows the operational status information 72 regarding the aforementioned operating part group during the specified period of aggregation while arranging the operational status information 72 according to the types of the operating parts included in the operating part group. In yet other words, this graph arranges the temporal breakdown of the specifically classified operational statuses of the substrate processing apparatus 1 during the specified period of aggregation according to the types of the operating parts, which serve as one arrangement item. In the window 545, the vertical axis of the graph indicates the type of the operating part, and the horizontal axis indicates the temporal breakdown of the specifically classified operational statuses. Note that LP on the vertical axis indicates the load port group 110, Robot indicates the indexer robot 12 and the center robot 22, and MPC indicates the processing unit group 210.

Figure 33:
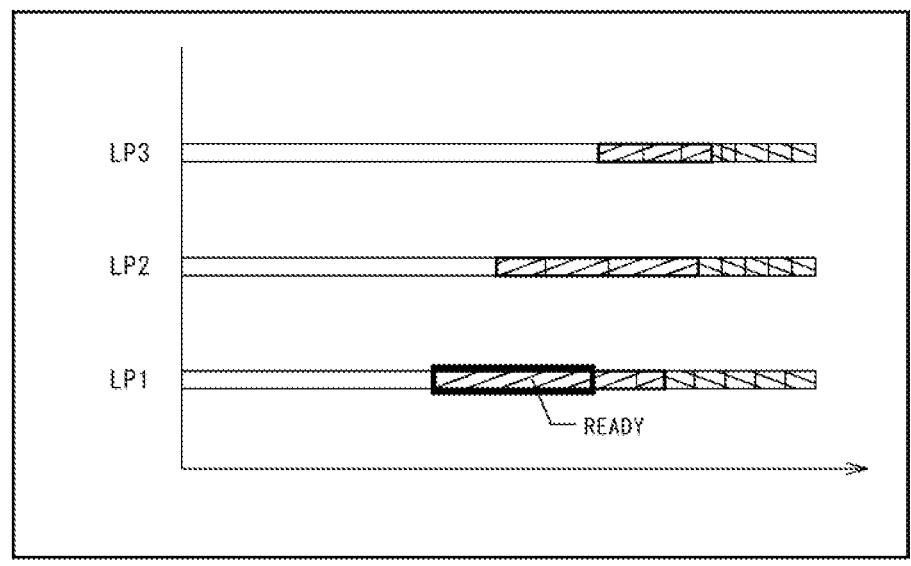
FIG. 33 is a diagram showing part of a screen on the display in enlarged dimensions.

As illustrated in FIG. 33, the window 546 displays a stacked horizontal bar graph in which the operational status information 72 regarding the load port group 110 during the specified period of aggregation is arranged according to the load ports 11. In other words, this graph arranges the temporal breakdowns of the specifically classified operational statuses of the load port group 110 during the specified period of aggregation according to the names (i.e., identifiers) of the load ports 11, which serve as one arrangement item. In the window 546, the vertical axis of the graph indicates the name of the load port 11, and the horizontal axis indicates the temporal breakdown of the specifically classified operational statuses. This graph shows the temporal breakdown of the specifically classified operational statuses of each load port 11 during the specified period of aggregation.

Alternatively, for example, the window 546 may display a graph in which the operational status information 72 regarding the processing unit group 210 during the specified period of aggregation is arranged according to the processing units 21. As another alternative, for example, the window 546 may display a graph in which the operational status information 72 regarding the indexer robot 12 and the center robot 22 during the specified period of aggregation is arranged according to the robots.

It is preferable in the graphs displayed in the above-described windows 542 to 546 that, when the operational status information 72 during the specified period of aggregation includes a specifically classified operational status that has become deteriorated to a predetermined degree or more as compared with the reference operational status information, the display controller 62 highlights a portion corresponding to this specifically classified operational status in the graph (i.e., displays this specifically classified operational status in a more noticeable way than the surroundings). Specifically, for example, referring to the graph of FIG. 33 that shows the temporal breakdown of the specifically classified operational statuses of each load port 11, when the proportion of the "Ready" status of LP1 in the temporal breakdown is a predetermined number of times (e.g., twice) or more the proportion of the "Ready" status of LP1 in the temporal breakdown indicated by the reference operational status information, the portion corresponding to the "Ready" status of LP1 in FIG. 33 is displayed brighter than the surroundings or flashes on and off. This enables the operator to easily recognize a load port 11 in which some sort of an abnormal event has occurred, and more likely one of the specifically classified operational statuses in which an abnormal even has occurred in this load port 11.

Alternatively, the graphs displayed in the windows 542 to 546 may show the temporal breakdown of the broadly classified operational statuses of the substrate processing apparatus 1 during the specified period of aggregation. In this case as well, it is preferable that, when the operational status information 72 during the specified period of aggregation includes a broadly classified operational statuses that has become deteriorated to a predetermined degree or more as compared with the reference operational status information, the display controller 62 highlights a portion corresponding to this broadly classified operational status in the graph (i.e., displays this portion in a more noticeable way than the surroundings) in approximately the same manner as described above.

The table shown in FIG. 22 and the graphs shown in FIGS. 23 to 27 display the processing result information 71 regarding one substrate processing apparatus 1, but in the same manner, they may display the processing result information 71 regarding a substrate processing apparatus group that includes a plurality of substrate processing apparatuses 1. The table shown in FIG. 28 and the graphs shown in FIGS. 29 to 33 display the operational status information 72 regarding one substrate processing apparatus 1, but in the same manner, they may display the operational status information 72 regarding the substrate processing apparatus group including a plurality of substrate processing apparatuses 1. In either case, the aforementioned arrangement item group includes the name (i.e., identifier) of each substrate processing apparatus 1.

As described above, it is preferable in the substrate processing apparatus 1 that the aforementioned arrangement item group includes one or more of operating period, operation time zone, operating days of the week, and processing recipe as arrangement items and that the display controller 62 is capable of displaying the processing result information 71 on the information display (i.e., the display 87) while arranging the processing result information 71 according to the one or more items. This enables the operator who views the display 87 to easily analyze the result of the processing of substrates 9 performed by the substrate processing apparatus 1 from various angles.

As described above, it is preferable in the substrate processing apparatus 1 that the processing result information during a predetermined reference period of aggregation, namely the reference processing result information, is prepared in advance and that the display controller 62 is capable of providing a display that makes it possible to compare the processing result information 71 during a selected specified period of aggregation and the reference processing result information. This enables the operator to easily recognize the presence of an abnormal event that may have occurred in the processing of substrates 9 during the specified period of aggregation.

As described above, it is preferable in the substrate processing apparatus 1 that the display controller 62 displays the operational status information 72 regarding the operating part group on the display 87 while arranging the operational status information 72 according to the types of the operating parts included in the operating part group. This enables the operator to easily check the operational status of the substrate processing apparatus 1 during the specified period of aggregation according to the types of the operating parts. In the case where an abnormal event has occurred in the operational status of the substrate processing apparatus 1, the operator is able to easily analysis which type of the operating parts is the cause of the abnormal event.

As described above, it is preferable in the substrate processing apparatus 1 that the aforementioned arrangement item group includes one or more of operating period, operation time zone, and operating days of the week as arrangement items and that the display controller 62 is capable of displaying the operational status information 72 on the display 87 while arranging the operational status information 72 according to the one or more items. This enables the operator who views the display 87 to easily analyze the operational status of the substrate processing apparatus 1 from various angles.

As described above, it is preferable in the substrate processing apparatus 1 that the processing result information during a predetermined reference period of aggregation, namely, the reference processing result information, is prepared in advance and that the display controller 62 is capable of displaying the operational status information 72 during a selected specified period of aggregation and highlighting a broadly or specifically classified operational status that has become deteriorated to a predetermined degree or more as compared with a corresponding one indicated by the reference operational status information, out of the operational status information 72 during the selected specified period of aggregation. This enables the operator to, when an abnormal event has occurred in the operational status of the substrate processing apparatus 1, easily recognize both an operating part in which the abnormal event has occurred, and a broadly or specifically classified operational status that is presumed to be the cause of the abnormal event in the operating part.

The substrate processing apparatus 1, the display device, the program 89, and the analysis method of analyzing the operational status of the substrate processing apparatus 1 described above may be modified in various ways.

For example, the analysis method may include identifying, as a factor of deterioration of the processing result obtained by the substrate processing apparatus 1, any factor other than the aforementioned prolonged "Ready" status resulting from an insufficient number of carriers 95 transported into the substrate processing apparatus 1. The number of operating parts included in the aforementioned related operating part group may be changed to any value within the range of values greater than 1.

In the substrate processing apparatus 1, the operation information 70 (i.e., the processing result information 71 and the operational status information 72) displayed on the display 87 may be used for purposes other than the purpose of identifying the cause of deterioration of the processing result. The display controller 62 may display, for example, a variety of graphs and data other than those described above on the display 87 in accordance with an instruction from an operator.

In the substrate processing apparatus 1, each broadly classified operational status and its corresponding specifically classified operational statuses do not necessarily have to be displayed in similar colors in the graph in which the operational status information 72 is classified and displayed into broadly classified operational statuses (e.g., the stacked vertical bar graph 511*a* in FIG. 8) and in the graph in which the operational status information 72 is classified and displayed into specifically classified operational statuses (e.g., the stacked vertical bar graph 511*b* in FIG. 9). It is, however, preferable that each broadly classified operational status and its corresponding specifically classified operational statuses have a common feature (e.g., cross hatching) that is visually recognizable in the graph in order to enable the operator to easily recognize the correspondence between the broadly classified operational status and the specifically classified operational statuses.

The operation information stored in the information storage 61 does not necessarily have to include the operational status information 72 regarding all of the operating parts included in the operating part group, and may include the operational status information 72 regarding at least some of the operating parts included in the operating part group.

In the substrate processing apparatus 1, the time-line display of the operational status of each operating part does not necessarily have to be provided on the display 87.

The processing block 20 of the substrate processing apparatus 1 may include processing units having various structures other than the processing units 21. Besides, such processing units may perform a variety of processing other than liquid processing on substrates 9.

The substrate processing apparatus 1 described above may be used in processing of substrates other than semiconductor substrates, such as glass substrates for use in flat panel displays including liquid crystal displays and organic electroluminescence (EL) displays, or glass substrates for use in other displays. The substrate processing apparatus 1 described above may also be used in processing of substrates such as optical disk substrates, magnetic disk substrates, magneto-optical disk substrates, photomask substrates, ceramic substrates, and solar cell substrates.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Substrate processing apparatus
9 Substrate
11 Load port
12 Indexer robot
21 Processing unit
22 Center robot
61 Information storage
62 Display controller
70 Operation information
71 Processing result information
72 Operational status information
87 Display
110 Load port group
210 Processing unit group
S11 to S18 Step

The invention claimed is:

1. A substrate processing apparatus comprising:
a load port group that is a group of load ports each holding a carrier in which a plurality of substrates are to be housed;
a processing unit group that is a group of processing units in which a substrate is to be processed;
a transport mechanism that transports a substrate between said load port group and said processing unit group;
an information storage that stores operation information, the operation information being information regarding operations of an operating part group of operating parts that include said load port group, said processing unit group, and said transport mechanism;
an information display; and
a display controller that displays said operation information in a predetermined mode of display on said information display,
wherein said operation information includes:
processing result information indicating a result of substrate processing performed by said substrate processing apparatus; and
operational status information indicating a temporal breakdown of an operational status of said substrate processing apparatus and a temporal breakdown of an operational status of each operating part included in said operating part group,
the operational status of each of said substrate processing apparatus and said operating parts is hierarchically classified into a plurality of broadly classified operational statuses according to a large classification and into a plurality of specifically classified operational statuses obtained by further classifying said plurality of broadly classified operational statuses,
said display controller displays said processing result information on said information display while arranging said processing result information according to an arrangement item selected from among a predetermined arrangement item group that includes an arbitrary operating period of said substrate processing apparatus, and said display controller classifies said operational status information into said plurality of broadly classified operational statuses and into said plurality of specifically classified operational statuses and displays said operational status information that has been classified on said information display while arranging said operational status information according to an arrangement item selected from among said arrangement item group.

2. The substrate processing apparatus according to claim 1, wherein when classifying said operational status information into said broadly classified operational statuses and displaying said operational status information that has been classified on said information display while arranging said operational status information according to said arrangement item, said display controller displays said operational status information in a first graph in which said plurality of broadly classified operational statuses are divided by color, and when classifying said operational status information into said plurality of specifically classified operational statuses and displaying said operational status information that has been classified on said information display while arranging said operational status information according to said arrangement item, said display controller displays said operational status information in a second graph in which said plurality of specifically classified operational statuses are divided by color and in which a plurality of specifically classified operational statuses that belong to one broadly classified operational status are displayed in colors akin to a color of said one broadly classified operational status in said first graph.

3. The substrate processing apparatus according to claim 1, wherein said operational status information includes a time stamp that is associated with said operational status of each operating part and that indicates a starting point and an endpoint of said operational status, and said display controller provides a timeline display that indicates said operational status in time sequence on said information display.

4. The substrate processing apparatus according to claim 1, wherein said display controller displays said operational status information regarding said operating part group on said information display while arranging said operational status information regarding said operating part group according to types of said operating parts included in said operating part group.

5. The substrate processing apparatus according to claim 1, wherein said display controller displays said operational status information regarding said load port group on said information display while arranging said operational status information according to said load ports.

6. The substrate processing apparatus according to claim 1, wherein said display controller displays said operational status information regarding said processing unit group on said information display while arranging said operational status information according to said processing units.

7. The substrate processing apparatus according to claim 1, wherein said arrangement item group includes at least one item out of said operating period, an operation time zone, an operating day of the week, and a processing recipe as an arrangement item, and said display controller is capable of displaying said processing result information on said information display while arranging said processing result information according to said at least one item.

8. The substrate processing apparatus according to claim 1, wherein said arrangement item group includes at least one item out of said operating period, an operation time zone, and an operating day of the week as an arrangement item, and said display controller is capable of displaying said operational status information on said information display while arranging said operational status information according to said at least one item.

9. The substrate processing apparatus according to claim 1, wherein reference processing result information is prepared in advance, the reference processing result information being said processing result information that is collected during a predetermined reference period of aggregation, and said display controller provides a display that makes it possible to compare said processing result information and said reference processing result information that are collected during a selected specified period of aggregation.

10. The substrate processing apparatus according to claim 1, wherein reference operational status information is prepared in advance, the reference operational status information being said operational status information that is collected during a predetermined reference period of aggregation, and said display controller displays and compares said operational status information that is collected during a selected specified period of aggregation with said reference operational status information to highlight a broadly classified operational status or a specifically classified operational status that has degraded to a predetermined degree or more in said operational status information collected during said specified period of aggregation.

11. The substrate processing apparatus according to claim 1, wherein said display controller also displays, on said information display, said processing result information and said operational status information both regarding a different substrate processing apparatus that is identical in configuration to said substrate processing apparatus.

12. An analysis method of analyzing an operational status of a substrate processing apparatus, the analysis method comprising:

a) causing the substrate processing apparatus according to claim 1 to display said processing result information on said information display while arranging said processing result information according to an arbitrary operating period of said substrate processing apparatus;

b) classifying said operational status information into said plurality of broadly classified operational statuses and displaying said operational status information that has been classified on said information display while arranging said operational status information according to said operating period;

c) classifying one broadly classified operational status that is presumed to be a cause of degradation in processing result among said plurality of broadly classified operational statuses, into said plurality of specifically classified operational statuses and displaying said one broadly classified operational status that has been classified on said information display; and d) focusing on one specifically classified operational status that is presumed to be a cause of degradation in processing result among said plurality of specifically classified operational statuses, selecting a related operating part group that is a group of operating parts relating to said one specifically classified operational status from among said operating part group, and providing, on said information display, a timeline display that indicates the operational status of said substrate processing apparatus in time sequence and a timeline display that indicates an operational status of each operating part included in said related operating part group in time sequence.

13. A display device for displaying an operational status of a substrate processing apparatus, the substrate processing apparatus including a load port group that is a group of load ports each holding a carrier in which a plurality of substrates are to be stored, a processing unit group that is a group of processing units in which a substrate is to be processed, and a transport mechanism that transports a substrate between said load port group and said processing unit group, the display device comprising:

an information display; and a display controller that displays operation information in a predetermined mode of display on said information display, the operation information being information regarding operations of an operating part group of operating parts that include said load port group, said processing unit group, and said transport mechanism, wherein said operation information includes:

processing result information indicating a result of substrate processing performed by said substrate processing apparatus; and operational status information indicating a temporal breakdown of the operational status of said substrate processing apparatus and a temporal breakdown of an operational status of each operating part included in said operating part group, the operational status of each of said substrate processing apparatus and said operating parts is hierarchically classified into a plurality of broadly classified operational statuses according to a large classification and into a plurality of specifically classified operational statuses obtained by further classifying said plurality of broadly classified operational statuses, said display controller displays said processing result information on said information display while arranging said processing result information according to an arrangement item selected from among a predetermined arrangement item group that includes an arbitrary operating period of said substrate processing apparatus, and said display controller classifies said operational status information into said plurality of broadly classified operational statuses and into said plurality of specifically classified operational statuses and displays said operational status information that has been classified on said information display while arranging said operational status information according to an arrangement item selected from among said arrangement item group.

14. A non-transitory computer readable medium storing a program for causing a substrate processing apparatus to display operation information in a predetermined mode of display on an information display, the substrate processing apparatus including a load port group that is a group of load ports each holding a carrier in which a plurality of substrates are to be stored, a processing unit group that is a group of processing units in which a substrate is to be processed, and a transport mechanism that transports a substrate between said load port group and said processing unit group, the operation information being information regarding operations of an operating part group of operating parts that include said load port group, said processing unit group, and said transport group, wherein the operation information includes:

processing result information indicating a result of substrate processing performed by said substrate processing apparatus; and operational status information indicating a temporal breakdown of an operational status of said substrate processing apparatus and a temporal breakdown of an operational status of each operating part included in said operating part group, the operational status of each of said substrate processing apparatus and said operating parts is hierarchically classified into a plurality of broadly classified operational statuses according to a large classification and into a plurality of specifically classified operational statuses obtained by further classifying said plurality of broadly classified operational statuses, and said program is executed by a computer to:

display said processing result information on said information display while arranging said processing result information according to an arrangement item selected from among a predetermined arrangement item group that includes an arbitrary operating period of said substrate processing apparatus, and classify said operational status information into said plurality of broadly classified operational statuses and into said the plurality of specifically classified operational statuses and display said operational status information that has been classified on said information display while arranging said operational status information according to an arrangement item selected from among said arrangement item group.

* * * * *